(12) United States Patent
Fukasawa et al.

(10) Patent No.: US 6,507,092 B1
(45) Date of Patent: Jan. 14, 2003

(54) SEMICONDUCTOR DEVICE HAVING INCREASED RELIABILITY AND METHOD OF PRODUCING THE SAME AND SEMICONDUCTOR CHIP SUITABLE FOR SUCH A SEMICONDUCTOR DEVICE AND METHOD OF PRODUCING THE SAME

(75) Inventors: Norio Fukasawa, Kawasaki (JP); Takashi Hozumi, Kasugai (JP); Toshimi Kawahara, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 183 days.

(21) Appl. No.: 09/714,648

(22) Filed: Nov. 17, 2000

(30) Foreign Application Priority Data

Apr. 3, 2000 (JP) ........................................ 2000-101613

(51) Int. Cl.⁷ ............................................ H01L 23/544
(52) U.S. Cl. ...................... 257/620; 257/724; 257/787; 257/797
(58) Field of Search ............................... 438/22, 33, 48, 438/57, 68, 106, 107, 110, 113, 114, 115, 455, 458, 459, 460, 462, 463, 464, 465, 978; 257/618, 620, 622, 623, 678, 723, 724, 734, 787, 797

(56) References Cited

U.S. PATENT DOCUMENTS 6,117,347 A * 9/2000 Ishida .......................... 216/52
6,207,477 B1 * 3/2001 Motooka et al. ............. 438/113

FOREIGN PATENT DOCUMENTS

EP                143510        * 10/2001

* cited by examiner

Primary Examiner—Albert W. Paladini
Assistant Examiner—Alonzo Chambliss
(74) Attorney, Agent, or Firm—Armstrong, Westerman & Hattori LLP

(57) ABSTRACT

A semiconductor device is provided, which device includes a semiconductor chip including external terminals formed on a surface thereof and a sealing resin formed on the surface of the semiconductor chip. A contaminant film formed on the surface of said semiconductor chip has a laser-processed edge so that a peripheral portion of the surface of said semiconductor chip is bonded to the sealing resin.

9 Claims, 20 Drawing Sheets

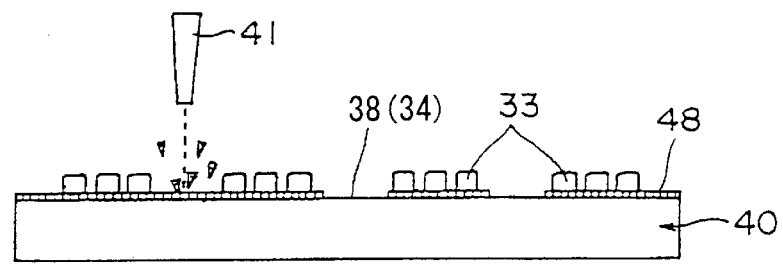
FIG. 16A
FIG. 16B
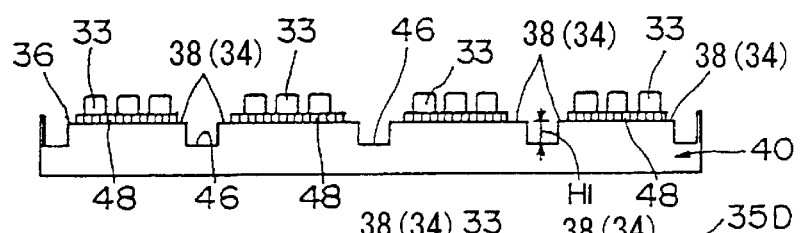
FIG. 16C
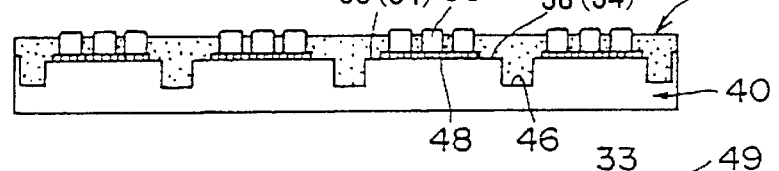
FIG. 16D
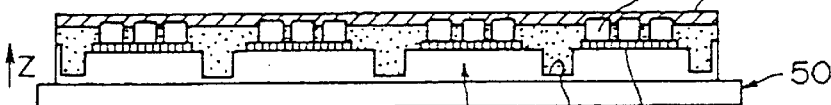
FIG. 16E
FIG. 16F
FIG. 16G
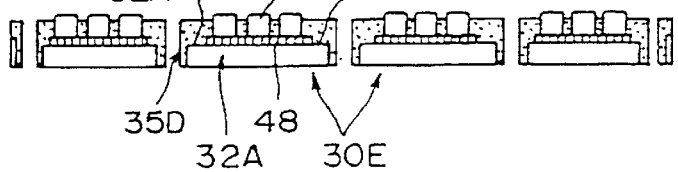

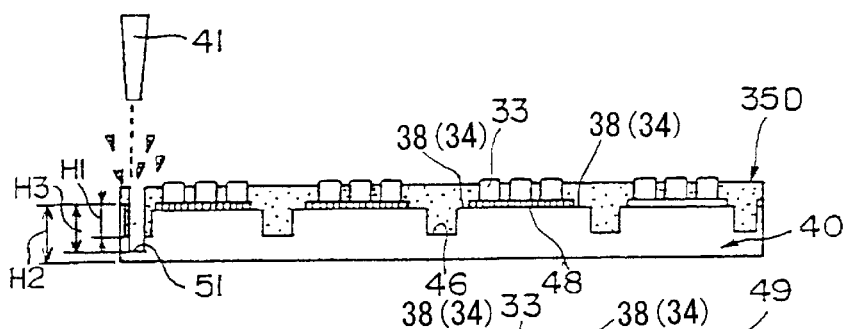
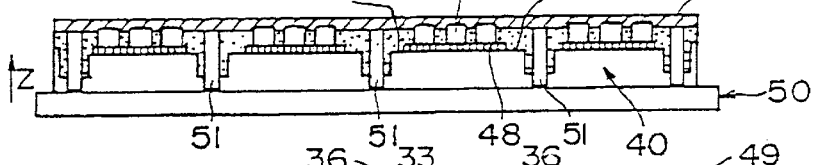
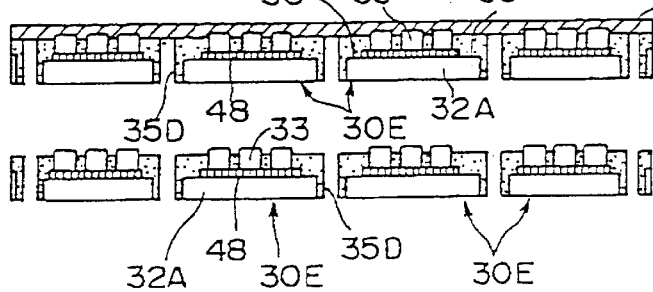
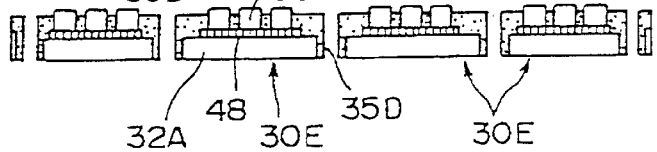
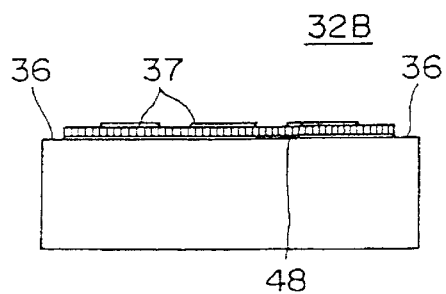

SEMICONDUCTOR DEVICE HAVING INCREASED RELIABILITY AND METHOD OF PRODUCING THE SAME AND SEMICONDUCTOR CHIP SUITABLE FOR SUCH A SEMICONDUCTOR DEVICE AND METHOD OF PRODUCING THE SAME

BACKGROUND OF THE INVENTION

1. Field of the Invention

The present invention relates generally to semiconductor devices and methods of producing the same and semiconductor chips and methods of producing the same, and more particularly to a semiconductor device having a chip size package (CSP) structure, in which a sealing resin is formed on a semiconductor chip, and a method of producing the same, and a semiconductor chip for such a semiconductor device and a method of producing the same.

Recently, attempts have been made to produce a smaller size semiconductor device having a higher density in order to meet a demand for a smaller electronic device and apparatus. Therefore, a semiconductor device having a so-called CSP structure is employed, the semiconductor device being downsized by being shaped as close to a semiconductor chip as possible.

In order to obtain a package of a real chip size and to increase a production efficiency, so-called wafer level packaging is proposed. According to the wafer level packaging, a substrate is packaged with a plurality of semiconductor chips formed thereon, and the as-packaged substrate is divided into individual small-size semiconductor devices.

2. Description of the Related Art

FIG. 1 shows a semiconductor device 1A obtained by conventional wafer level packaging. The semiconductor device 1A is a semiconductor device of a so-called CSP type and includes a semiconductor chip 2A, a sealing resin 5A and solder balls 4. The semiconductor chip 2A has a plurality of external terminals 3 formed protrusively on its upper surface. The sealing resin 5A is formed on the upper surface of the semiconductor chip 2A so that the upper portions of the external terminals appear partially from the sealing resin 5A. The solder balls 4 are formed on the portions of the external terminals 5A appearing from the sealing resin 5A.

When heat is applied to the semiconductor chip 2A and the sealing resin 5A, which have different expansion coefficients, the sealing resin 5A may come off the semiconductor chip 2A because of a difference in thermal expansion therebetween. In order to prevent the sealing resin 5A from coming off the semiconductor chip 2A, the peripheral portion of the semiconductor chip 2A is formed into a rectangular step-like portion 6 having an L-shaped cross section. According to this structure, the step-like portion 6 is filled with the sealing resin 5A when the sealing resin 5A is formed, so that the sealing resin 5A in the step-like portion 6 produces an anchoring effect. This increases the bonding strength of the sealing resin 5A and the semiconductor chip 2A so as to prevent the sealing resin 5A from coming off the semiconductor chip 2A.

FIGS. 2A through 2G are diagrams for illustrating the outline of the production method of the semiconductor device 1A having the above-described structure. According to FIGS. 2A through 2G, especially, a method of forming the step-like portion 6 is mainly shown. In the production of the semiconductor device 1A, a method of simultaneously obtaining a plurality of semiconductor devices from one semiconductor substrate (hereinafter, a wafer) is taken. A more specific description of the method will be given in the following. First, the circuits of the individual semiconductor chips 2A are formed on the surface (hereinafter, a circuit-containing surface) of the wafer 10. Then, the external terminals 3 are formed on the circuit-containing surface, and a resin film of polyimide or the like (not shown) is formed on the circuit-containing surface for the protection thereof.

Next, as shown in FIGS. 2A through 2C, rectangular grooves 12 are formed in the wafer 10 along predetermined dicing lines (cutting lines) on the circuit-containing surface thereof by employing a dicing saw for grooving (hereinafter, a grooving dicing saw) 11A. After the rectangular grooves 12 are formed, the sealing resin 5A is formed on the same surface on which the rectangular grooves 12 are formed as shown in FIG. 2D. At this point, the rectangular grooves 12 are filled with the sealing resin 5A. Further, the sealing resin 5A is formed so that the upper portions of the protrusion electrodes appear partially from the sealing resin 5A.

Next, as shown in FIGS. 2E and 2F, a dicing process is performed on the wafer 10 using a dicing saw for cutting (hereinafter, a cutting dicing saw) 13. The thickness of the cutting edge of the cutting dicing saw 13 is narrower than that of the grooving dicing saw 11A.

Therefore, as shown in FIG. 2G, each individual semiconductor device 1A obtained after the dicing process includes the step-like portion 6, which is formed as a result of cutting into two each of the rectangular grooves 12 filled with the sealing resin 5A. Since the rectangular grooves 12 are filled with the sealing resin 5A as previously described, the step-like portions 6 formed after the dicing process are also filled with the sealing resin 5A. Therefore, the sealing resin 5A produces the above-described anchoring effect in each of the step-like portions 6 so as to be prevented from coming off each of the semiconductor chips 2A.

FIG. 3 shows a semiconductor device 1B having another structure obtained by the conventional wafer level packaging. FIGS. 4A through 4G are diagrams showing the outline of the production method of the semiconductor device 1B. In FIGS. 3 through 4G, the same elements as those of previously-described FIGS. 1 through 2G are referred to by the same numerals and a description thereof will be omitted.

The semiconductor device 1B shown in FIG. 3 is also a semiconductor device of the CSP type, and has the same basic structure as the semiconductor device 1A shown in FIG. 1. However, according to the semiconductor device 1A shown in FIG. 1, the semiconductor chip 2A includes the step-like portion 6 filled with the sealing resin 5A so that the semiconductor chip 2A and the sealing resin 5A are bonded strongly by the anchoring effect produced by the sealing resin 5A.

On the other hand, according to the semiconductor device 1B shown in FIG. 3, the peripheral portion of the semiconductor chip 2A is formed into a tapered portion 7 covered with the sealing resin 5A. Also according to this structure, an area in which the sealing resin 5A and the semiconductor chip 2A are bonded is increased so as to increase the bonding strength thereof. Therefore, the sealing resin 5A is prevented from coming off the semiconductor chip 2A.

In order to produce the semiconductor device 1B having the above-described tapered portion 7, a grooving dicing saw 11B is employed. The cross section of the edge portion of the grooving dicing saw 11B has a triangular shape as shown in FIGS. 4A through 4C. Triangular grooves 14 are formed in the wafer 10 along predetermined dicing lines (cutting lines) on the circuit-containing surface thereof by employing the grooving dicing saw 11B. After the triangular grooves 14 are formed, the sealing resin 5A is formed as shown in FIG. 4D, so that the triangular grooves 14 are filled with the sealing resin 5A.

Next, as shown in FIGS. 4E and 4F, the dicing process is performed on the wafer 10 using the cutting dicing saw 13. The thickness of the cutting edge of the cutting dicing saw 13 is narrower than that of the grooving dicing saw 11B. Therefore, as shown in FIG. 4G, each individual semiconductor device 1B obtained after the dicing process includes the tapered portion 7, which is formed as a result of cutting into two each of the triangular grooves 14 filled with the sealing resin 5A.

Since the triangular grooves 14 are filled with the sealing resin 5A as previously described, the tapered portions 7 formed after the dicing process are also filled with the sealing resin 5A. Therefore, the sealing resin 5A produces the above-described anchoring effect in each of the tapered portions 7 so as to prevent the sealing resin 5A from coming off each of the semiconductor chips 2A.

The description has been given, with reference to FIGS. 1 through 4G, of the semiconductor devices 1A and 1B of the CSP type and the production methods thereof. On the other hand, there is a semiconductor device including a semiconductor chip obtained by cutting a wafer in advance into individual semiconductor chips.

FIGS. 5A and 5B illustrate the dicing process of a method of producing a semiconductor chip to be included in a semiconductor device of such a type. Dicing is performed along predetermined dicing lines (cutting lines) on the circuit-containing surface of the wafer 10 by employing the cutting dicing saw 13 shown in FIG. 5A, so that individual semiconductor chips 2B are obtained as shown in FIG. 5B.

A thin film formed on top of the wafer 10 in FIGS. 5A and 5B is a contaminant 18. Residues left in the processes performed during the formation of the electronic circuits of the respective semiconductor chips 2B on the wafer 10, such as an impurity diffusion process, a thin film deposition process and a photolithography process, and the residue of the resin film for the protection of the circuit-containing surface of the wafer 10 remain to form the contaminant 18 on the wafer 10. Although not graphically represented, the contaminant 18 exists also on the wafer 10 shown in FIGS. 2A through 2G and 4A through 4G.

FIGS. 6 through 8 are diagrams respectively showing semiconductor devices 1C through 1E each including the semiconductor chip 2B produced by the above-described method.

The semiconductor device 1C shown in FIG. 6 is a semiconductor device of a tape carrier package (TCP) type. The semiconductor device 1C includes the semiconductor chip 2B including bumps 23 formed thereon and a tape automated bonding (TAB) tape 20 including a base film 21 and interconnection lines 22 formed thereon. The semiconductor chip 2B is bonded to the interconnection lines 22 by flip chip bonding. A sealing resin 5B is formed in the area surrounding the junctions of the semiconductor chip 2B and the TAB tape 20 so as to protect the joining points of the bumps 23 and the interconnection lines 22 and a surface of the semiconductor chip 2B on which surface the electronic circuit is formed. Hereinafter, the surface is referred to as a circuit-containing surface of the semiconductor chip 2B.

The semiconductor device 1D shown in FIG. 7 is a semiconductor device of a ball grid array (BGA) type. The semiconductor device 1D includes the semiconductor chip 2B including the bumps 23 formed thereon and a printed-circuit board 24A including the solder balls 4 formed on the lower side thereof. The semiconductor chip 2B is bonded to the printed-circuit board 24A in a face-down manner. The solder balls 4 and the bumps 23 are electrically connected via through holes formed in the printed-circuit board 24A. A sealing resin 5C referred to as an underfill resin is interposed between the semiconductor chip 2B and the printed-circuit board 24A.

The semiconductor device 1E shown in FIG. 8 is a semiconductor device of a face-down ball grid array (FDBGA) type. According to the semiconductor device 1E, which is frequently used for the production of DRAMs, a pad 26 is formed in the center of the circuit-containing surface of the semiconductor chip 2B. A printed-circuit board 24B having an opening in the center portion thereof is provided to face the circuit-containing surface of the semiconductor chip 2B. The printed-circuit board 24B and the pad 26 are electrically connected by a wire 25 provided through the opening.

The solder balls 4 are formed on the lower surface of the printed-circuit board 24B so as to be electrically connected to the pad 26 of the semiconductor chip 2B. Further, a sealing resin 5D is formed between the semiconductor chip 2B and the printed-circuit board 24B and on the sides of the semiconductor chip 2B.

According to the conventional semiconductor devices 1A or 1B, as previously described, the step-like portion 6 or the tapered portion 7 is formed to increase the bonding strength of the sealing resin 5A and the semiconductor chip 2A so as to prevent the sealing resin 5A from coming off the semiconductor chip 2A.

Therefore, according to the conventional production method, the rectangular grooves 12 or the triangular grooves 14 are formed in the wafer 10 along the dicing lines on the circuit-containing surface thereof so as to form the step-like portion 6 or the tapered portion 7. The rectangular grooves 12 or the triangular grooves 14 are formed by employing the grooving dicing saw 11A or 11B as shown in FIGS. 2A through 2C or 4A through 4C. In other words, conventionally, the step-like portion 6 or the tapered portion 7 is formed by machining.

However, forming the step-like portion 6 or the tapered portion 7 by machining inevitably generates residual stress in the position where the step-like portion 6 or the tapered portion 7 is formed. Therefore, when heat is applied to the semiconductor device 1A or 1B, causing a difference in thermal expansion between the semiconductor chip 2A and the sealing resin 5A, a force resulting from the difference in thermal expansion greatly affects the position where the residual stress exists, so that a crack 16 or a breakage 17 is produced in the position where the step-like portion 6 or the tapered portion 7 is formed, as shown in FIGS. 9A and 9B or 10A and 10B.

Further, when the rectangular grooves 12 or the triangular grooves 14 are formed by machining in the wafer 10 by employing the grooving dicing saw 11A or 11B, stress concentration is focused on the corner portions of the rectangular grooves 12 or the bottom portions of the triangular grooves 14, so that the wafer 10 has the crack 16 or the breakage 17 as shown in FIG. 11A or 11B.

Furthermore, a film of the contaminant 18 is inevitably formed on the circuit-containing surface of the wafer 10 through the processes performed during the formation of the electronic circuits of the respective semiconductor chips 2B on the wafer 10. The contaminant 18 has a poor connectivity with each of the sealing resins 5A through 5D. Therefore, if each of the semiconductor devices 1A through 1E is produced using either the semiconductor chip 2A or 2B each including the contaminant 18 remaining thereon, a space 19 is formed between each of the sealing resin 5A through 5D and the semiconductor chip 2A or 2B as shown in FIGS. 9A through 10B or 6 through 8, thus decreasing the reliability of each of the semiconductor devices 1A through 1E.

Further, when the wafer 10 is cut into the individual semiconductor chips 2B simply by employing the cutting dicing saw 13 in the dicing process as shown in FIGS. 5A and 5B, the semiconductor chip 2B has residual stresses generated also in the positions on which dicing is provided because the dicing process employing the cutting dicing saw 13 is also a mechanical operation. Therefore, when the semiconductor chip 2B including the residual stresses is used for the semiconductor devices 1C through 1E, the semiconductor chip 2B may have the crack 16 (or a breakage) as shown in FIGS. 6 through 8 as a result of a difference in thermal expansion between the semiconductor chip 2B and each of the sealing resins 5B through 5D caused by heat application.

SUMMARY OF THE INVENTION

It is a general object of the present invention to provide a semiconductor device and a method of producing the same and a semiconductor chip and a method of producing the same in which the above disadvantages are eliminated.

A more specific object of the present invention is to provide a semiconductor device prevented from having a crack or breakage and thus to have increased reliability and a method of producing the same, and a semiconductor chip suitable for such a semiconductor device and a method of producing the same.

The above objects of the present invention are achieved by a semiconductor device including a semiconductor chip including external terminals formed on a surface thereof and a sealing resin formed on the surface of the semiconductor chip, wherein a contaminant film formed on the surface of the semiconductor chip has a laser-processed edge so that a peripheral portion of the surface of said semiconductor chip is bonded to the sealing resin.

According to the above-described semiconductor device, the peripheral portion of the contaminant film is removed by a laser beam projection so that an exposed portion is formed on the peripheral portion of the surface of the semiconductor chip.

When the contaminant film remains on the surface of the semiconductor chip, the bonding strength of the semiconductor chip and the sealing resin is reduced. Therefore, by forming the exposed portion in which the semiconductor chip is exposed, the bonding strength of the semiconductor chip and the sealing resin is increased in the exposed portion so that the sealing resin is prevented from coming off the semiconductor chip.

Further, since the contaminant film is removed by the laser processing according to this semiconductor device, stress generated in the semiconductor chip when the exposed portion is formed can be reduced compared with a semiconductor device formed by a method employing a mechanical operation to remove the contaminant. Therefore, even if force resulting from a difference in thermal expansion between the sealing resin and the semiconductor chip is applied to the exposed portion, the position where the exposed portion is formed is prevented from having a crack or breakage.

The above objects of the present invention are also achieved by a method of producing a semiconductor device, which method includes the steps of (a) removing a portion of a contaminant film from a surface of a semiconductor substrate by a laser beam projection so as to form an exposed portion on the surface, (b) forming a sealing resin on the surface so that the sealing resin is bonded to the exposed portion, and (c) cutting the semiconductor substrate and the sealing resin together along predetermined cutting lines so as to obtain individual semiconductor devices.

According to the above-described method, the portion of the contaminant film is removed by the laser beam projection to form the exposed portion. Therefore, stress generated in the semiconductor substrate when the contaminant film is removed can be reduced compared with a mechanical method in which the contaminant film is removed by machining. Further, the sealing resin is formed to be bonded to the exposed portion so that the bonding strength of the semiconductor substrate and the sealing resin is increased in the exposed portion.

The above objects of the present invention are also achieved by a semiconductor device including a semiconductor chip including external terminals formed on a surface thereof and a sealing resin formed on the surface and sides of the semiconductor chip, wherein a contaminant film formed on the surface of said semiconductor chip has a laser-processed edge so that a peripheral portion of the surface of said semiconductor chip is bonded to the sealing resin.

According to the above-described semiconductor device, the sealing resin is formed on the sides of the semiconductor chip in addition to the surface thereof. Since the contaminant film does not exist on the sides of the semiconductor chip, the bonding strength of the sealing resin and the semiconductor chip is further strengthened.

The above objects of the present invention are also achieved by a method of producing a semiconductor device, which method includes the steps of (a) removing a contaminant from a first surface of a semiconductor substrate by a laser beam projection so as to form an exposed portion on the first surface, and (b) forming groove portions in, the respective linear portions.

According to the above-described method, the contaminant film is removed by the laser beam projection to the exposed portion. Therefore, stress generated in the semiconductor substrate when the contaminant film is removed can be reduced compared with a mechanical method in which the contaminant film is removed by machining.

The above objects of the present invention are also achieved by a method of producing a semiconductor device, which method includes the steps of (a) removing a contaminant from a first surface of a semiconductor substrate by a laser beam projection so as to form an exposed portion on the first surface, (b) forming first groove portions in the exposed portion, (c) forming a sealing resin on the first surface so that the sealing resin is bonded to the exposed portion and the first groove portions, (d) forming second groove portions in the sealing resin and the semiconductor substrate along predetermined cutting lines in the exposed portion by a laser beam projection, and (e) grinding a second surface of the semiconductor substrate with a tape material being applied on the first surface until the second surface is connected with the second groove portions so that the semiconductor substrate is cut along the cutting lines into individual semiconductor devices, the second surface opposing the first surface.

According to the above-described method, the second surface of the semiconductor substrate is ground until the second surface is connected with the second groove portions so that the wafer is cut into the individual semiconductor devices. Therefore, this method does not require a separate cutting process, thus simplifying the production facilities and process. Further, the sealing resin is formed to be bonded to the exposed portion and the groove portions so that the bonding strength of the semiconductor substrate and the sealing resin is increased in the exposed portion and the groove portions.

Moreover, the back grinding process is performed on the semiconductor substrate so that the semiconductor substrate becomes thinner to be prevented from having a warp. During the back grinding process, which is a mechanical operation, great stress is generated in the semiconductor substrate. However, since the exposed portion and the sealing resin are bonded with a high bonding strength, the sealing resin is prevented from coming off the semiconductor substrate even if the stress is applied to the junction of the exposed portion and the sealing resin.

The above objects of the present invention are also achieved by a semiconductor chip included, in a semiconductor device including a sealing resin, which semiconductor chip includes electrode portions formed on a surface thereof and an exposed portion formed on a peripheral portion of the surface, wherein a contaminant film formed on the surface of the semiconductor chip has a laser-processed edge so as to form the exposed portion.

According to the above-described semiconductor chip, the peripheral portion of the contaminant film is removed by the laser beam projection to form the exposed portion on the surface of the semiconductor chip. Therefore, when the semiconductor chip is included in the semiconductor device, the bonding strength of the sealing resin and the exposed portion is increased so as to prevent the sealing resin from coming off the semiconductor chip. Further, since the contaminant film is removed by the laser processing, stress generated in the semiconductor chip when the exposed portion is formed can be reduced compared with a semiconductor chip formed by a method employing a mechanical operation to remove the contaminant. Therefore, even if force resulting from a difference in thermal expansion between the sealing resin and the semiconductor chip is applied to the exposed portion when the semiconductor chip is included in the semiconductor device, the position where the exposed portion is formed is prevented from having a crack or breakage.

The above objects of the present invention are also achieved by a method of producing a semiconductor chip included in a semiconductor device including a sealing resin, which method includes the steps of (a) removing a portion of a contaminant from a surface of a semiconductor substrate by a laser beam projection so as to form an exposed portion on the surface and (b) cutting the semiconductor substrate along predetermined cutting lines so as to obtain individual semiconductor chips.

According to the above-describe method, the portion of the contaminant film is removed by the laser beam projection to form the exposed portion. Therefore, stress generated in the semiconductor substrate when the contaminant film is removed can be reduced compared with a mechanical method in which the contaminant film is removed by machining.

The above objects of the present invention are further achieved by a method of producing a semiconductor chip included in a semiconductor device including a sealing resin, which method includes the steps of (a) projecting a laser beam on a first surface of a semiconductor substrate so as to successively form groove portions in the first, surface along predetermined cutting lines and an exposed portion on the first surface by removing a contaminant film from surroundings of the cutting lines and (b) grinding a second surface of the semiconductor substrate with a tape material being applied on the first surface until the second surface is connected with the groove portions so that the semiconductor substrate is cut along the cutting lines into individual semiconductor chips, the second surface opposing the first surface.

According to the above-described method, the laser beam is projected on the first surface of the semiconductor substrate so as to successively form the groove portions in the first surface along the predetermined cutting lines and the exposed portion on the first surface by removing the contaminant film from the surroundings of the cutting lines. Therefore, the production process can be simplified.

Further, the second surface of the semiconductor substrate is ground until the second surface is connected with the groove portions so that the wafer is cut into the individual semiconductor devices. Therefore, this method does not require a separate cutting process, thus simplifying the production facilities and process. Moreover, the semiconductor substrate becomes thinner by the back grounding so as to be prevented from having a warp.

BRIEF DESCRIPTION OF THE DRAWINGS

Other objects, features and advantages of the present invention will become more apparent from the following detailed description when read in conjunction with the accompanying drawings, in which:

FIGS. 16A through 16G are diagrams for illustrating a production method of the semiconductor device of FIG. 15 according to a fourth embodiment of the present invention;

FIGS. 17A through 17D are diagrams for illustrating another production method of the semiconductor device of FIG. 15 according to a fifth embodiment of the present invention;

FIG. 18 is a sectional view of a semiconductor chip according to a sixth embodiment of the present invention;

DETAILED DESCRIPTION OF THE PREFERRED EMBODIMENTS

A description will now be given, with reference to the accompanying drawings, of embodiments of the present invention.

Figure 12:
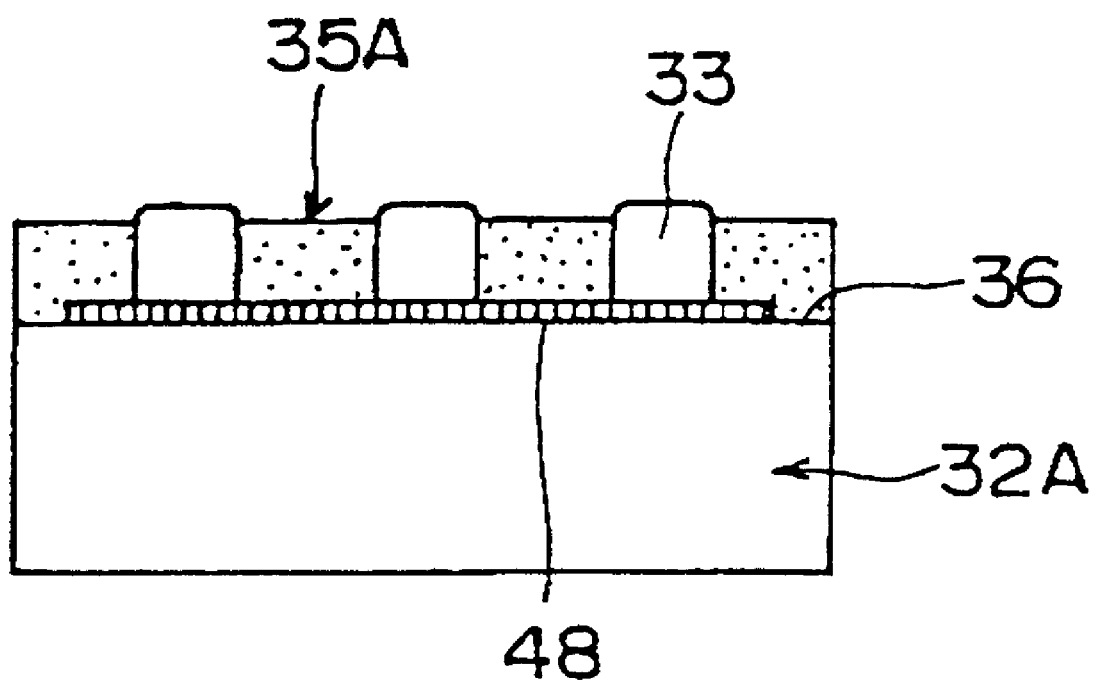
FIG. 12 is a sectional view of a semiconductor device according to a first embodiment of the present invention.

FIG. 12 shows a semiconductor device 30A according to a first embodiment of the present invention. FIGS. 13A through 13E are diagrams showing a principal part of a method of producing the semiconductor device 30A according to a second embodiment of the present invention.

The semiconductor device 30A has a very simple structure including a semiconductor chip 32A, external terminals 33, and a layer of a sealing resin 35A. The semiconductor chip 32A includes an electronic circuit (not shown) formed on its upper surface (hereinafter, a circuit-containing surface) in FIG. 12. The external terminals 33 are formed on pad portions (not shown) formed on the circuit-containing surface, for example, by plating so that each of the external terminals 33 has a predetermined height.

The sealing resin 35A, which is, for example, an epoxy-based resin, is formed to protect the circuit-containing surface of the semiconductor chip 32A and the external terminals 33. The upper end portions of the external terminals 33 appear from the sealing resin 35A so that the external terminals 33 serve as the external connection terminals of the semiconductor device 30A.

A thin film including a contaminant 48 is formed on the circuit-containing surface of the semiconductor chip 32A. Residues left in the processes performed during the formation of the electronic circuits of the individual semiconductor chips 32A on a wafer 40, such as an impurity diffusion process, a thin film deposition process and a photolithography process (see FIGS. 13A through 13E), and the residue of a resin film (usually a polyimide film) for the protection of a surface of the wafer 40 on which surface the electronic circuits are formed (hereinafter, a circuit-containing surface) remain to form the contaminant 48 on the wafer 40. The contaminant 48 has a poor connectivity with the sealing resin 35A.

The peripheral portion of the contaminant 48 is removed so that an individual exposed (peripheral) portion 36 is formed on the semiconductor chip 32A, in which portion the semiconductor chip 32A is exposed without being covered with the contaminant 48. As described later, the individual exposed portion 36 is formed by removing the contaminant 48 by laser processing. The formation range of the individual exposed portion 36 is determined so as to obtain as wide an area as possible around the periphery of a region of the circuit-containing surface of the semiconductor chip 32A, in which region the electronic circuit is formed. Hereinafter, the region is referred to as a circuit-containing region of the semiconductor chip 32A, and the circuit-containing regions of the semiconductor chips 32A on the wafer 40 are collectively referred to as a circuit-containing region of the wafer 40. The individual exposed portion 36 is not formed on the circuit-containing region of the semiconductor chip 32A so as to prevent the circuit-containing region from being damaged by a laser beam projection provided in the laser processing of the individual exposed portion 36.

According to the semiconductor device 30A of this embodiment, the individual exposed portion 36 is formed on the circuit-containing surface of the semiconductor chip 32A so that a portion of the circuit-containing surface is exposed without being covered with the contaminant 48. The semiconductor chip 32A has a good connectivity with the sealing resin 35A. Therefore, the semiconductor chip 32A and the sealing resin 35A are bonded strongly so as to prevent the sealing resin 35A from coming off the semiconductor chip 32A, thus increasing the reliability of the semiconductor device 30A.

Next, a description will be given of the method of producing the semiconductor device 30A having the above-described structure according to the second embodiment of the present invention.

FIGS. 13A through 13E are diagrams for illustrating the principal part of the method of producing the semiconductor device 30A. Particularly, a method of producing the individual exposed portion 36 is mainly graphically represented in FIGS. 13A through 13E.

In the production of the semiconductor device 30A, a method of simultaneously obtaining a plurality of semiconductor devices from one semiconductor substrate (a wafer) is taken. A more specific description of the method will be given in the following. First, the electronic circuits of the individual semiconductor chips 32A are formed on the circuit-containing surface of the wafer 40. Then, the external terminals 33 are formed on the circuit-containing surface by plating or the like, and a resin film of polyimide or the like (not shown) is formed on the circuit-containing surface for the protection thereof.

Figure 13A:
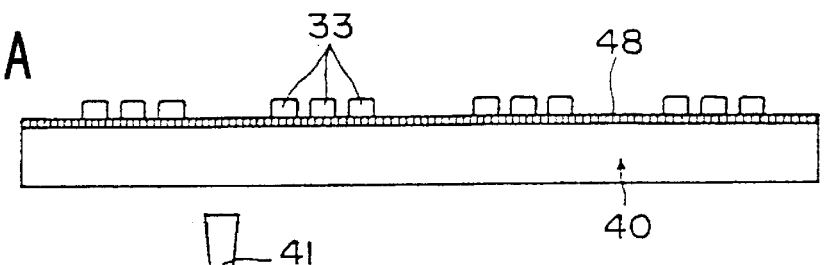
FIGS. 13A through 13E are diagrams for illustrating a production method of the semiconductor device of FIG. 12 according to a second embodiment of the present invention.

FIG. 13A shows the wafer 40 obtained after a series of the above-described processes are over. In this state, the contaminant 48 remains on the entire upper surface (circuit-containing surface) of the wafer 40. As previously described, the contaminant 48 is residual dust or the like left on the wafer 40 in the processes performed during the formation of the electronic circuits on the wafer 40 and in the formation of the resin film for the protection of the circuit-containing surface of the wafer 40.

Figure 13B:
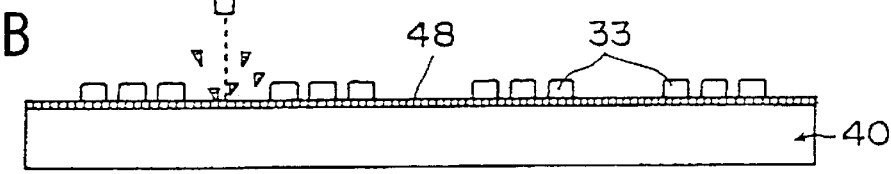

On the above-described wafer 40, a contaminant removal process is performed first to remove the contaminant 48 to form an exposed portion 34 on the wafer 40, which portion includes the individual exposed portions 36 of the individual semiconductor chips 32A. In the contaminant removal process, as shown in FIG. 13B, a laser beam is projected, by using a laser beam projection apparatus 41, on the wafer 40 to remove the contaminant 48 formed on its upper surface. A laser beam generation apparatus having a short laser pulse width and a high output level, such as an excimer laser, a YAG laser, or a $CO_2$ laser, can be employed as the laser beam projection apparatus 41. Specifically, it is desirable to use a laser beam generation apparatus having an oscillation wavelength in the range of 250 to 1,100 nm.

Figure 13C:
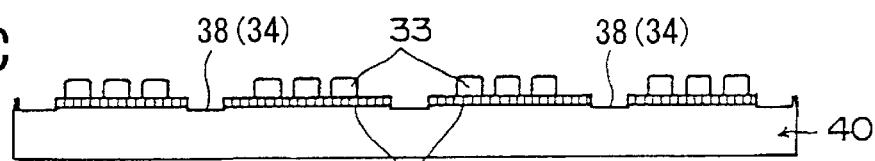

A region of the circuit-containing surface of the wafer 40, on which region the laser beam is projected, is referred to as a laser beam projection region. The laser beam projection region of the wafer 40 includes linear portions 38 arranged in a grid-like manner. The laser beam projection region is determined so as to include predetermined cutting lines on the circuit-containing surface of the wafer 40, along which cutting lines the wafer 40 is cut into the individual semiconductor devices 30A. The laser beam projection region is further determined so that each of the linear portions 38 has a width wider, at least, than that of a space formed between each adjacent semiconductor devices 30A when the wafer 40 is cut into the individual semiconductor devices 30A. The latter width is almost as thick as that of the cutting dicing saw 13 shown in FIG. 13E. However, for the above-mentioned reason, the laser beam is not projected on the circuit-containing region of the wafer 40. The laser beam projection region becomes the exposed portion 34 of the wafer 40. Therefore, the exposed portion 34 of the wafer 40 also includes the linear portions 38. FIG. 13C shows the linear portions 38 of the exposed portion 34 of the wafer 40 formed by the laser beam projection.

Figure 13D:
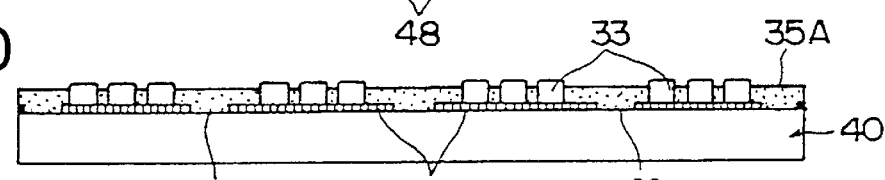

The above-described contaminant removal process is followed by a sealing resin formation process in which the sealing resin 35A is formed on the wafer 40 including the linear portions 38 of the exposed portion 34. The sealing resin 35A is formed, for example, by compression molding. FIG. 13D shows a state where the sealing resin 35A is formed on the wafer 40. As shown in FIG. 13D, the sealing resin 35A is formed on the entire circuit-formed surface of the wafer 40. Therefore, the sealing resin 35A is also formed in the linear portions 38 of the exposed portion 34. Since the contaminant 48 is removed from each of the linear portions 38 of the exposed portion 34, the sealing resin 35A is directly bonded to the wafer 40.

Figure 13E:
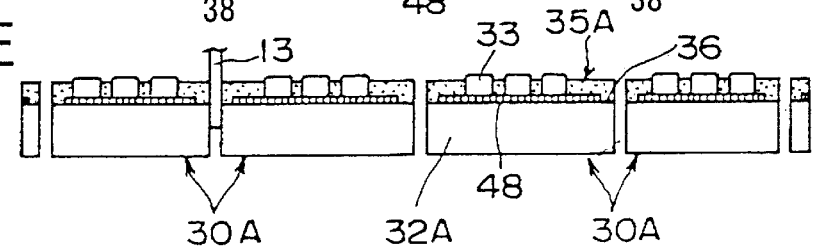

When the above-described sealing resin formation process is completed, a cutting process is performed. In the cutting process, as shown in FIG. 13E, the wafer 40 and the sealing resin 35A are cut together, by means of the cutting dicing saw 13, along the predetermined cutting lines in the respective linear portions 38 of the exposed portion 34. Thus, the wafer 40 is cut into the individual semiconductor devices 30A, and each of the linear portions 38 are cut into two so that the individual exposed portions 36 are formed in the respective semiconductor devices 30A.

As previously described, according to the production method of this embodiment, the laser beam projection is provided in the contaminant removal process to obtain the exposed portion 38 of the wafer 40 by removing the contaminant 48. The contaminant 48 can be mechanically removed by means of, for example, a lapping material or a tool. However, if the contaminant 48 is removed by machining, residual stress is generated in the wafer 40 so that each of the semiconductor devices 30A may have a crack or breakage for the above-described reason.

On the other hand, according to the method of removing the contaminant 48 by means of the laser beam, the residual stress generated in the wafer 40 when the exposed portion 34 is formed can be reduced compared with the above-mentioned mechanical method. Particularly, since the laser beam projection apparatus 41 having a short laser pulse width and an oscillation wavelength in the range of 250 to 1,100 nm is employed in this embodiment, the contaminant 48 can be removed instantaneously so that the wafer 40 is unaffected by heat generated by the laser beam projection. Therefore, according to the method of removing the contaminant 48 by means of the laser beam, each of the semiconductor devices 30A is free of a crack or breakage even if heat is applied thereto after the production thereof, thus increasing the reliability of each of the semiconductor devices 30A.

As previously described, since each of the linear portions 38 of the exposed portion 34 has the width wider than that of the space formed between each adjacent semiconductor devices 30A, the individual semiconductor chips 32A, into which the wafer 40 is cut, still include the respective individual exposed portions 36. Further, the bonding strengths of the semiconductor chips 32A and the sealing resin 35A are strong in the respective individual exposed portions 36. Therefore, each of the individual semiconductor chips 32A is firmly bonded to the sealing resin 35A so that the sealing resin 35A is prevented from coming off each of the semiconductor chips 32A, thus increasing the reliability of each of the semiconductor devices 30A.

A description will now be given, with reference to FIGS. 14A and 14B, of details of a structure of one of the linear portions 38 of the exposed portion 34 of the wafer 40.

Figure 14A:
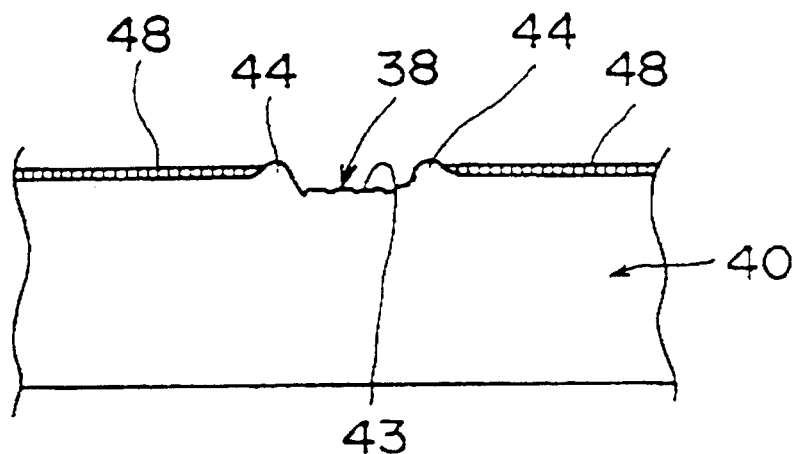
FIGS. 14A and 14B are enlarged sectional views of a linear portion of an exposed portion and protrusion portions of a semiconductor chip of the semiconductor device of FIG. 12.

FIG. 14A is an enlarged view of the linear portion 38 in a state where the contaminant removal process is completed. As shown in FIG. 14A, the contaminant 48 is removed from the linear portion 38 by the laser beam projection. The linear portion 38 has a slightly depressed shape because of the laser beam projection. The bottom portion 43 of the linear portion 38 has a rough surface having minute irregularities. The surface of the bottom portion 43 is rougher than that of the contaminant 48. The wafer material (chip material) rises at the edge portion (peripheral portion) of the bottom portion 43 so as to form protrusion portions 44. The protrusion portions 44 are thus formed because the wafer material melted by the laser beam projection is pushed to the periphery by the energy of the laser beam projection.

Figure 14B:
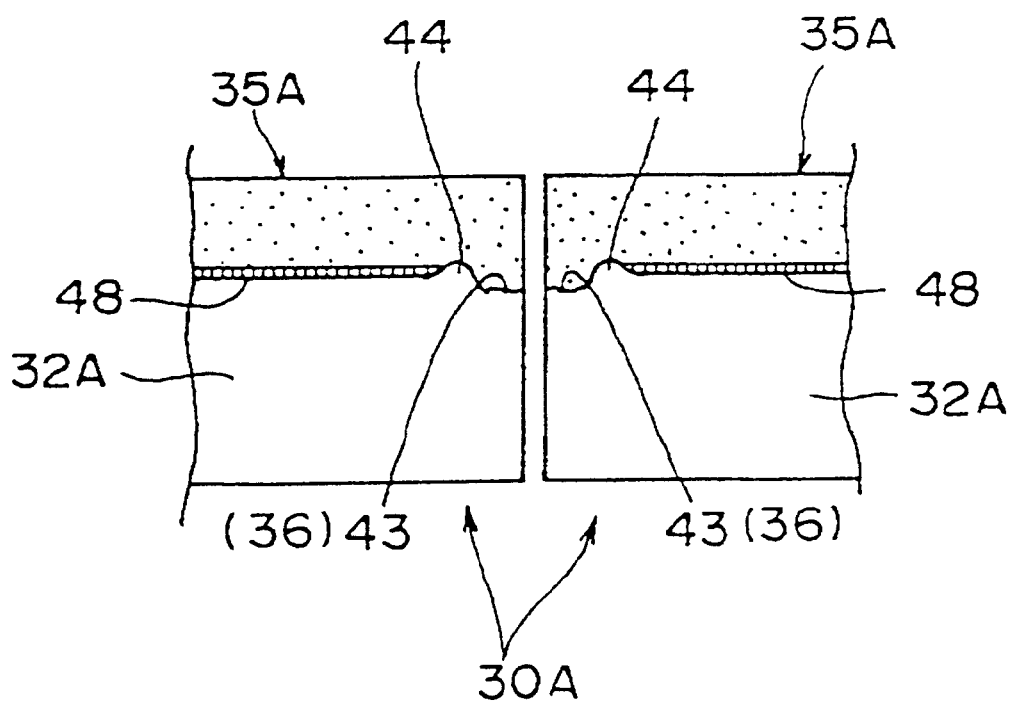

FIG. 14B shows a state where the cutting process is performed after the sealing resin 35 is formed on the linear portion 38 having the above-described structure. In FIG. 14B, the linear portion 38 is cut into two of the individual exposed portions 36. As shown in FIG. 14B, the sealing resin 35A is formed on the wafer 40 so that the individual exposed portions 36 are also filled with the sealing resin 35A. Since the bottom portion 43 of each of the individual exposed portions 36 has the rough surface as previously described, the sealing resin 35A engages the minute irregularities forming the rough surface. Further, as the contaminant 48 is removed from the individual exposed portions 36, each of the individual exposed portions 36 has a high connectivity with the sealing resin 35A. Therefore, each of the individual exposed portions 36 and the sealing resin 35A can be bonded firmly so that the sealing resin 35A can surely be prevented from coming off each of the semiconductor chips 32A.

Further, as described above, each of the protrusion portions 44 is formed at the edge portion of each of the individual exposed portions 36 or the bottom portions 43. Each of the protrusion portions 44 sticks into the sealing resin 35A when the sealing resin 35A is formed, so that each of the protrusion portions 44 produces the anchoring effect on the sealing resin 35A. The protrusion portions 44 are formed integrally with the respective semiconductor chips 32A without the contaminant 48 being stuck thereto. Therefore, the protrusion portions 44 and the sealing resin 35A are bonded firmly so that the sealing resin 35A can surely be prevented from coming off the semiconductor chip 32A.

Figure 15:
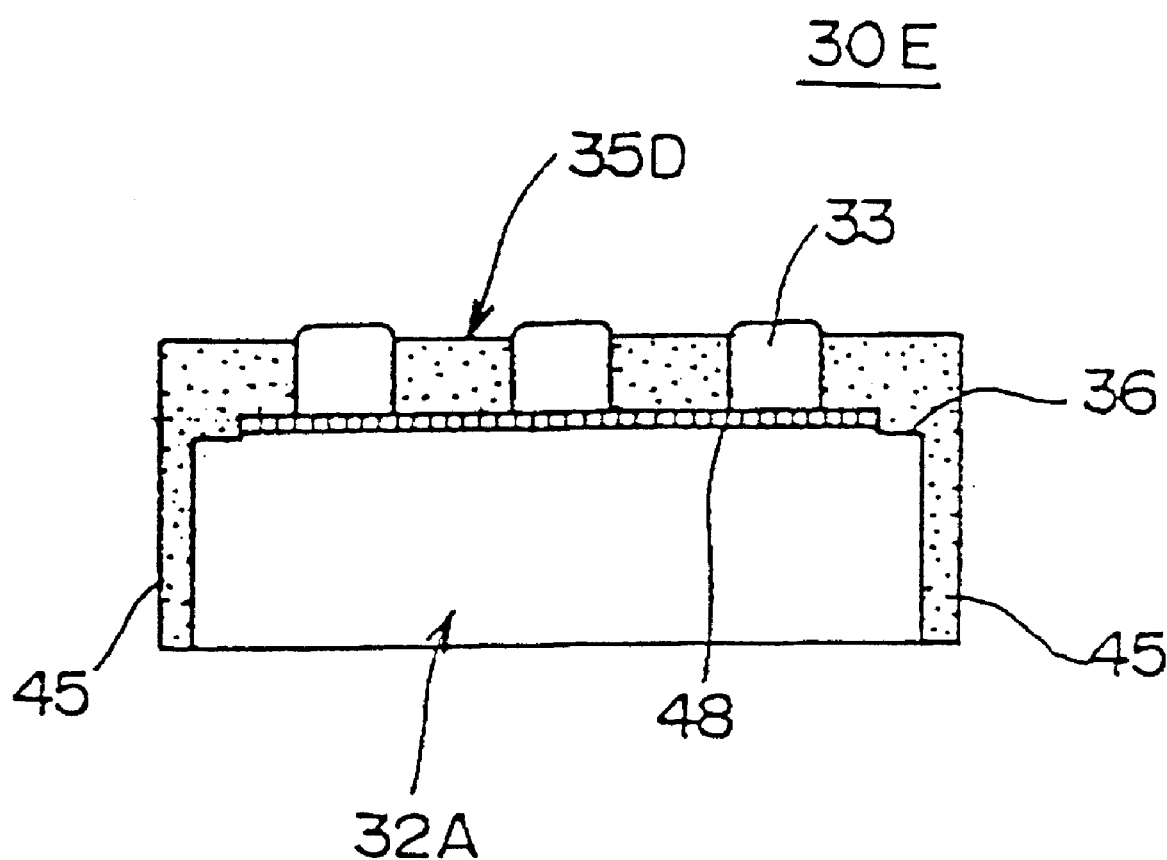
FIG. 15 is a sectional view of a semiconductor device according to a third embodiment of the present invention.

FIG. 15 shows a semiconductor device 30E according to a third embodiment of the present invention. FIGS. 16A through 16G and 17A through 17D shows respective methods of producing the semiconductor device 30E. In FIGS. 15 through 17D, the same elements as those of FIGS. 12 through 14B are referred to by the same numerals and a description thereof will be omitted.

The semiconductor device 30E according to this embodiment basically has the same structure as the semiconductor device 30A shown in FIG. 12. However, the semiconductor device 30E differs from the semiconductor device 30A in that a side-sealing portion 45, which is a portion of a sealing resin 35D, is formed on each side of the semiconductor chip 32A.

According to this embodiment, as previously described, the side sealing portions 45, which are portions of the sealing resin 35D, are bonded to the sides of the semiconductor chip 32A. Since the contaminant 48 does not exist on the sides of the semiconductor chip 32A, the semiconductor chip 32A and the side sealing portions 45 are firmly bonded. Therefore, the semiconductor device 30E according to this embodiment more reliably prevents the sealing resin 35D from coming off the semiconductor chip 32A.

Next, a description will be given, with reference to FIGS. 16A through 16G, of the method of producing the semiconductor device 30E according to a fourth embodiment of the present invention.

Also in this embodiment, as shown in FIG. 16A, the contaminant 48 is removed from the wafer 40 by using the laser beam projection apparatus 41, and the contaminant removal process is performed to form the exposed portion 34. As in the above-described second embodiment, the laser beam projection region includes predetermined cutting lines on the circuit-containing surface of the wafer 40, along which cutting lines the wafer 40 is cut into the individual semiconductor devices 30E. The laser beam projection region is further determined so that each of the linear portions 38 has a width wider, at least, than that of a space formed between each adjacent semiconductor devices 30E when the wafer 40 is cut into the individual semiconductor devices 30E. The laser beam projection region becomes the exposed portion 34 of the wafer 40. Therefore, the exposed portion 34 of the wafer 40 also includes the linear portions 38.

According to this embodiment, the above-described contaminant removal process is followed by a groove formation process in which deep grooves 46 are formed in the respective linear portions 38 of the exposed portion 34. The same laser beam projection apparatus 41 as used to form the linear portions 38 of the exposed portion 34 can be used to form the deep grooves 46.

As the laser beam projection apparatus 41 used in this embodiment is the laser beam generation apparatus having the short laser pulse width and the oscillation wavelength in the range from 250 to 1,100 nm, as previously described, the wafer 40, which is made of silicon in this embodiment, can be grooved directly. Therefore, the contaminant removal process for forming the exposed portion 34 and the groove formation process for forming the deep grooves 46 can be performed successively, thus allowing the efficiency of the production process of the semiconductor device 30E to be increased.

Each of the deep grooves 46 is formed in the above-described manner so as to have a width wider than that of the space between each adjacent semiconductor devices 30E, or that of the edge of the cutting dicing saw 13, and narrower than that of each of the linear portions 38 of the exposed portion 34. Further, the vertical dimension of the depth H1 (indicated by arrows in FIG. 16B) of each of the deep grooves 46 is determined so as to be smaller than that (thickness) of the wafer 40. Therefore, when the deep grooves 46 are formed, the wafer 40 maintains an integrated form without being cut into the individual semiconductor chips 32A.

When the above-described groove formation process is completed, the sealing resin formation process is performed to form the sealing resin 35D on the wafer 40 including the exposed portions 34 and the deep grooves 46. The sealing resin 35D is formed, for example, by compression molding. FIG. 16C shows a state where the sealing resin 35D is formed on the wafer 40.

As shown in FIG. 16C, the sealing resin 35D is formed on the entire circuit-containing surface of the wafer 40 so as to be formed on the exposed portions 34 and fill inside the deep grooves 46. At this point, the exposed portions 34 are free of the contaminant 48 and the wafer 40 is exposed on each side of the respective deep grooves 46. Therefore, the sealing resin 35D is firmly bonded to the exposed portions 34 and the deep grooves 46, so that the wafer 40 and the sealing resin 35D are bonded with a high bonding strength.

The above-described sealing resin formation process is followed by a back grinding process in which the backside surface (a surface on the opposite side to that of the circuit-containing surface on which the sealing resin 35D is formed) of the wafer 40 is ground after an adhesive tape 49 is applied on the sealing resin 35D. FIG. 16D shows a state where the back grinding is provided on the wafer 40. In the back grinding provided on the wafer 40, the backside surface of the wafer 40 is ground in a direction indicated by an arrow Z by means of a grinder 50 (a grindstone). The back grinding is provided until the sealing resin 35D filled into the deep grooves 46 appears from the backside surface of the wafer 40.

FIG. 16E shows a state where the back grinding is provided until the sealing resin 35D filled into the deep grooves 46 appears from the backside surface of the wafer 40. In this state, the wafer 40 is cut into the individual semiconductor chips 32A. However, the individual semiconductor chips 32A are connected by the sealing resin 35D.

When the above-described back grinding process is completed, the cutting process is performed. In the cutting process, as shown in FIG. 16F, the sealing resin 35D is cut along the predetermined cutting lines in the deep grooves 46 by means of the cutting dicing saw 13. Thus, the sealing resin 35D is cut into portions corresponding to the respective individual semiconductor devices 30E, so that the semiconductor devices 30E are formed as shown in FIG. 16G.

As described above, also according to the production method of this embodiment, the contaminant 48 is removed by the laser beam projection in the contaminant removal process so that the exposed portion 34 is formed. Therefore, the residual stress generated in the wafer 40 when the exposed portion 34 and the deep grooves 46 are formed can be reduced by this method compared with a mechanical method in which the contaminant 48 is removed by machining. As a result, the wafer 40 and the semiconductor devices 30E are prevented from having cracks or breakages.

Before the deep grooves 46 are formed in the wafer 40 in the groove formation process, each of the linear portions 38 of the exposed portion 34 is formed to have the width wider than that of each of the deep grooves 46. Therefore, even after the formation of the deep grooves 46, the exposed portion 34 (individual exposed portions 36) remains on the portions of the wafer 40, which portions correspond to the respective semiconductor chips 32A. Thus, even after the formation of the deep grooves 46, the semiconductor chips 32A and the sealing resin 35D are bonded strongly so as to prevent the sealing resin 35D from coming off each of the semiconductor chips 32A.

Further, the wafer 40 becomes thinner by being subjected to the back grinding process so as to be prevented from having a warp. In the back grinding process, great stress is generated in the wafer 40 because the back grinding is a mechanical operation. However, the sealing resin 35D is already bonded to the individual exposed portions 36 and the deep grooves 46 with the high bonding strength when the back grinding is provided. Therefore, even if the stress caused by the back grinding is applied to the junctions of the individual exposed portions 36 and the sealing resin 35D, the sealing resin 35D is prevented from coming off the wafer 40.

Moreover, the portions of the wafer 40 on which portions the deep grooves 46 are formed are ground away in the back grinding process and do not exist when the cutting process is performed. Therefore, according to this method, only the sealing resin 35D has to be cut by the cutting dicing saw 13, thus providing longer life for the cutting dicing saw 13 compared with a method in which both of the wafer 40 and the sealing resin 35D are cut simultaneously.

Next, a description will be given, with reference to FIGS. 17A through 17D, of the method of producing the semiconductor device 30E according to a fifth embodiment of the present invention.

According to this embodiment, the contaminant removal process for forming the exposed portion 34, the groove formation process for forming the deep grooves 46 (first groove portions) in the linear portions 38 of the exposed portion 34, and the sealing resin formation process for forming the sealing resin 35D on the wafer 40 including the individual exposed portions 36 and the deep grooves 46, respectively shown in FIGS. 16A through 16C, are performed as in the above-described fourth embodiment. Particularly, the groove formation process is referred to as a first groove formation process in this embodiment.

When the above-described processes are over, a second groove formation process shown in FIG. 17A is performed in this embodiment. In the second groove formation process, cutting grooves 51 (second groove portions) are formed along the predetermined cutting lines in the respective linear portions 38 of the exposed portion 34 by the laser beam projection by means of the laser beam projection apparatus 41. The cutting grooves 51 are formed by removing the sealing resin 35D and the wafer 40 together by means of the laser beam. As shown in FIG. 17A, each of the cutting grooves 51 has a width narrower than that of each of the deep grooves 46 and a depth H3 having a vertical dimension greater than that of the depth H1 of each of the deep grooves 46 and smaller than that (thickness H2) of the wafer 40 (H1<H3<H2).

The above-described second groove formation process is followed by the back grinding process in which the backside surface (the surface on the opposite side to that of the circuit-containing surface on which the sealing resin 35D is formed) of the wafer 40 is ground after the adhesive tape 49 is applied on the sealing resin 35D. FIG. 17B shows a state where the back grinding is provided on the wafer 40. In providing the back grinding on the wafer 40, the backside surface of the wafer 40 is ground in a direction indicated by an arrow Z by means of the grinder 50. The back grinding is provided until the backside surface of the wafer 40 is connected with the cutting grooves 51.

FIG. 17C shows a state where the back grinding is provided until the backside surface of the wafer 40 is connected with the cutting grooves 51. In the second groove formation process performed before the back grinding process, the sealing resin 35D is also cut into the portions corresponding to the respective individual semiconductor devices 30E. Further, the wafer 40 is cut into the individual semiconductor chips 32A. Thus, the individual semiconductor devices 30E are formed when the back grinding process is completed.

However, the individual semiconductor devices 30E are kept attached to the adhesive tape 49 in a state immediately after the back grinding process is over. Therefore, as shown in FIG. 17D, the adhesive tape 49 should be removed from the individual semiconductor devices 30E before the individual semiconductor devices 30E are used. However, the individual semiconductor devices 30E can be shipped with the adhesive tape 49 applied thereto.

As described above, also according to the production method of this embodiment, the contaminant 48 is removed by the laser beam projection in the contaminant removal process so that the exposed portion 34 is formed. Therefore, the residual stress generated in the wafer 40 when the exposed portion 34 and the deep grooves 46 are formed can be reduced by this method compared with the mechanical method in which the contaminant 48 is removed by machining. As a result, the wafer 40 and the semiconductor devices 30E are prevented from having cracks or breakages.

Before the deep grooves 46 are formed in the wafer 40 in the first groove formation process, each of the linear portions 38 of the exposed portion 34 is formed to have the width wider than that of each of the deep grooves 46. Therefore, even after the formation of the deep grooves 46, the exposed portion 34 (individual exposed portions 36) remains on the portions of the wafer 40, which portions correspond to the respective semiconductor chips 32A. Thus, even after the formation of the deep grooves 46, the semiconductor chips 32A and the sealing resin 35D are bonded strongly so as to prevent the sealing resin 35D from coming off each of the semiconductor chips 32A.

Further, the wafer 40 becomes thinner by being subjected to the back grinding process so as to be prevented from having a warp. Moreover, the sealing resin 35D is already bonded to the exposed portion 34 (individual exposed portions 36) and the deep grooves 46 with the high bonding strength when the back grinding is provided. Therefore, the sealing resin 35D is prevented from coming off the wafer 40 in the back grinding process in which great stress is generated in the wafer 40.

Furthermore, according to this embodiment, the process of cutting the wafer 40 into the individual semiconductor devices 30E can be performed simultaneously with the back grinding process. Therefore, the cutting dicing saw 13 required in the second and fourth embodiments is not necessary in this embodiment, thus simplifying the production facilities and process.

FIG. 18 shows a semiconductor chip 32B according to a sixth embodiment of the present invention. FIGS. 19A through 19C and 21A through 21E show respective methods of producing the semiconductor chip 32B. In FIGS. 19A through 21E, the same elements as those of FIGS. 12 through 14B are referred to by the same numerals and a description thereof will be omitted.

Figure 22:
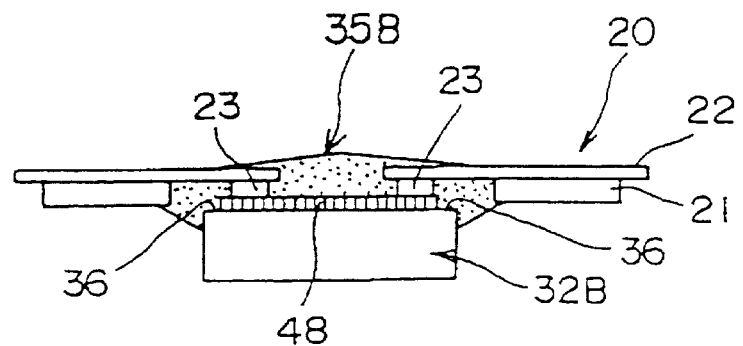
FIG. 22 is a diagram for illustrating a semiconductor device including the semiconductor chip of FIG. 18.
Figure 23:
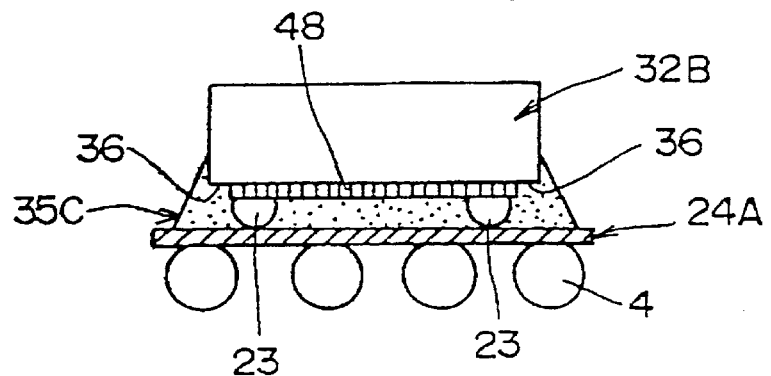
FIG. 23 is a diagram for illustrating another semiconductor device including the semiconductor chip of FIG. 18.
Figure 24:
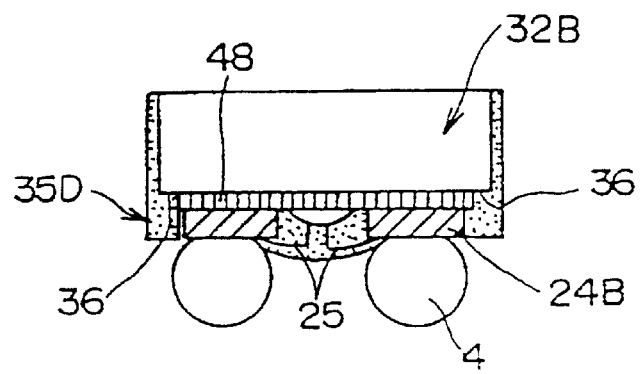
FIG. 24 is a diagram for illustrating another semiconductor device including the semiconductor chip of FIG. 18.

The semiconductor chip 32B shown in FIG. 18 is included in semiconductor devices 30B through 30D shown in FIGS. 22 through 24, respectively. The semiconductor chip 32B includes an electronic circuit (not shown) formed on its upper surface (hereinafter, a circuit-containing surface) in FIG. 18. A region of the circuit-containing surface, in which region the electronic circuit is formed, is referred to as a circuit-containing region of the semiconductor chip 32B, and the circuit-containing regions of the semiconductor chip 32B on the wafer 40 are collectively referred to as a circuit-containing region of the wafer 40. A plurality of electrode portions 37 and a film of the contaminant 48 are formed on the circuit-containing surface of the semiconductor chip 32B. According to this embodiment, a portion of the contaminant 48 is removed to form the individual exposed portion 36.

Figure 19A:
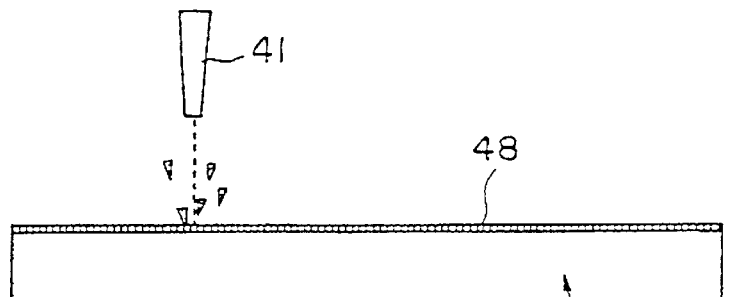
FIGS. 19A through 19C are diagrams for illustrating a production method of the semiconductor chip of FIG. 18 according to a seventh embodiment of the present invention.
Figure 19B:
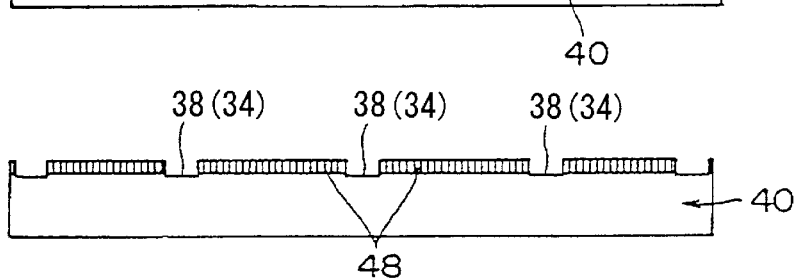
Figure 19C:
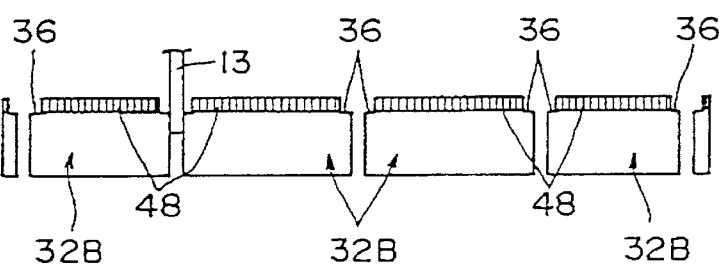

FIGS. 19A through 19C shows the method of producing the semiconductor chip 32B according to a seventh embodiment of the present invention. In the production of the semiconductor chip 32B, a method of simultaneously obtaining a plurality of semiconductor chips from the wafer 40 is taken.

FIG. 19A shows the wafer 40. As shown in FIG. 19A, the contaminant 48 is attached to the entire upper surface of the wafer 40. The contaminant 48 is residual dust or the like left on the wafer 40 in the processes performed during the formation of the electronic circuits on the wafer 40 and in the formation of the resin film for the protection of the circuit-containing surface of the wafer 40.

On the above-described wafer 40, the contaminant removal process is performed first to remove the contaminant 48 to form the exposed portion 34. In the contaminant removal process, as shown in FIG. 19A, the laser beam is projected, by using the laser beam projection apparatus 41, on the wafer 40 including the film of the contaminant 48 formed on its upper surface so that the contaminant 48 is removed. As the laser beam projection apparatus 41, a laser beam generation apparatus having a short laser pulse width, a high output level, and an oscillation wavelength in the range of 250 to 1,100 nm, such as an excimer laser, a YAG laser, or a $CO_2$ laser, can be employed.

At this point, the laser beam projection region is determined so as to include predetermined cutting lines on the circuit-containing surface of the wafer 40, along which cutting lines the wafer 40 is cut into the individual semiconductor chips 32B. The laser beam projection region is further determined so that each of the linear portions 38 has a width wider, at least, than that of a space formed between each adjacent semiconductor chips 32B when the wafer 40 is cut into the individual semiconductor chips 32B. The latter width is almost as thick as that of the cutting dicing saw 13 shown in FIG. 19C. However, the laser beam is not projected on the circuit-containing region of the circuit-containing surface of the wafer 40. The laser beam projection region becomes the exposed portion 34 of the wafer 40. Therefore, the exposed portion 34 of the wafer 40 also includes the linear portions 38.

When the above-described contaminant removal process is over, the cutting process is performed. As shown in FIG. 19C, the cutting process employs the cutting dicing saw 13 to cut the wafer 40 along the predetermined cutting lines in the respective linear portions 38 of the exposed portion 34. Thus, the wafer 40 is cut into the individual semiconductor chips 32B.

As described above, also according to the production method of this embodiment, the contaminant 48 is removed by the laser beam projection in the contaminant removal process so that the exposed portion 34 is formed. Therefore, the residual stress generated in the wafer 40 when the exposed portion 34 is formed can be reduced by this method compared with the mechanical method in which the contaminant 48 is removed by machining. Further, as previously described, before the deep grooves 46 are formed in the wafer 40 in the first groove formation process, each of the linear portions 38 of the exposed portion 34 is formed to have the width wider than that of each of the space between each adjacent semiconductor chips 32B. Therefore, even after the wafer 40 is cut into the individual semiconductor chips 32B, the individual exposed portions 36 remain thereon.

Figure 20A:
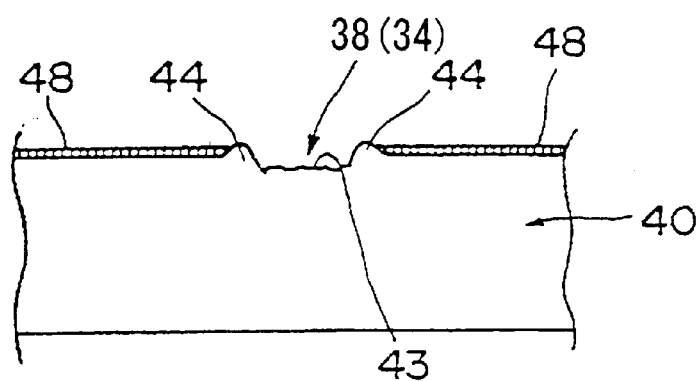
FIGS 20A and 20B are enlarged views of a linear portion of an exposed portion and protrusion portions of the semiconductor chip of FIG. 18.
Figure 20B:
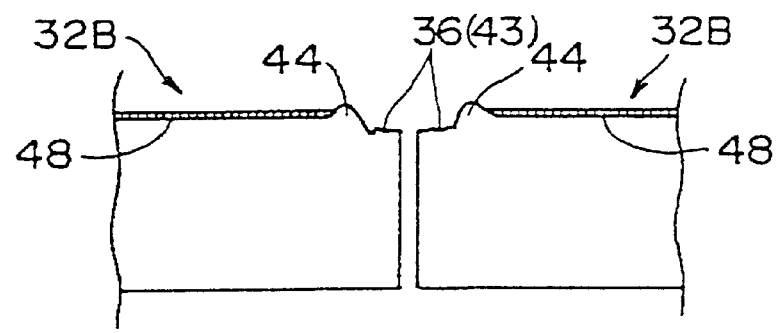

FIGS. 20A and 20B are enlarged views of one of the linear portions 38 of the exposed portion 34. As shown therein, the linear portion 38 of the exposed portion 34 formed in the production process of the semiconductor chip 32B also has the bottom portion 43 whose surface includes minute irregularities. The surface of the bottom portion 43 is also rougher than that of the contaminant 48. The wafer material (chip material) rises at the edge portion (peripheral portion) of the bottom portion 43 so as to form the protrusion portions 44.

FIGS. 21A through 21E shows the method of producing the semiconductor chip 32B according to an eighth embodiment of the present invention.

Figure 21A:
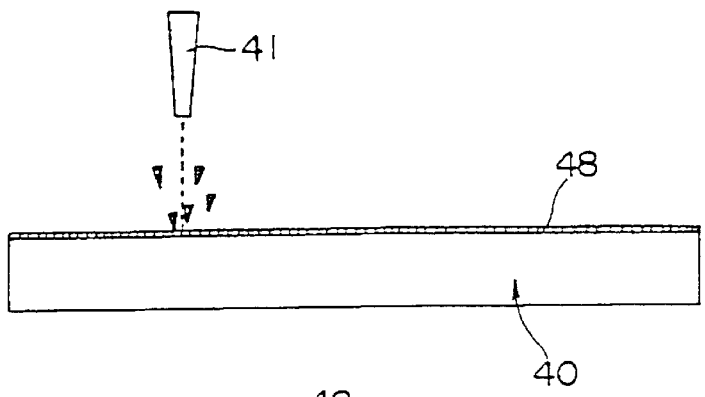
FIGS. 21A through 21E are diagrams for illustrating another production method of the semiconductor chip of FIG. 18 according to an eighth embodiment of the present invention.
Figure 21B:
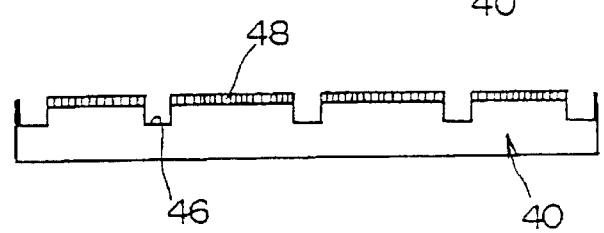

According to this embodiment, the groove formation process is performed first to form the deep grooves 46 in the wafer 40 along predetermined cutting lines as shown in FIGS. 21A and 21B. The deep grooves 46 are formed by means of the laser beam projection apparatus 41. Since the laser beam projection apparatus 41 used in this embodiment is the above-mentioned laser beam generation apparatus having the short laser pulse width and the oscillation wavelength in the range of 250 to 1,100 nm, the wafer 40, which is made of silicon in this embodiment, can be grooved directly.

Figure 21C:
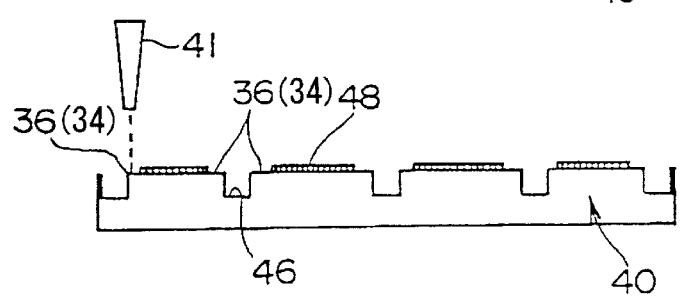

The above-described groove formation process is followed by the contaminant removal process, in which the contaminant 48 attached to the wafer 40 is removed by means of the laser beam projection apparatus 41 as shown in FIG. 21C. At this point, the laser beam is projected on a predetermined region formed between the peripheries of the circuit-containing regions of the individual semiconductor chips 32B and the edge portions of the deep grooves 46. Thus, the groove formation process is not necessarily performed after the contaminant removal process, and can be performed before the contaminant removal process as in this embodiment. Further, also according to this embodiment, the groove formation process for forming the deep grooves 46 and the contaminant removal process for forming the individual exposed portions 36 can be performed successively, thus allowing the efficiency of the production process of the semiconductor chip 32B to be increased. In this embodiment, the individual exposed portions 36 on the wafer 40 may collectively be referred to as the exposed portion 34 of the wafer 40, although the exposed portion 34 does not include the linear portions 38 in this case.

Figure 21D:
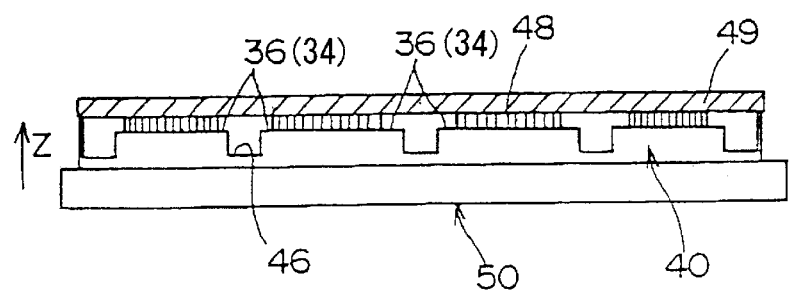
Figure 21E:
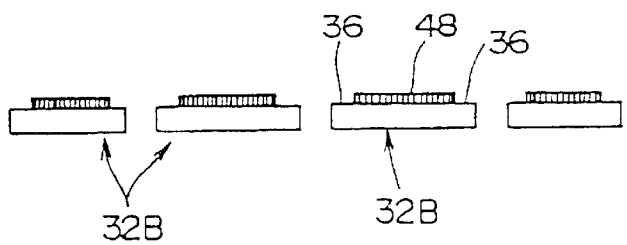

The above-described contaminant removal process is followed by the back grinding process in which the backside surface (the surface on the opposite side to that of the circuit-containing surface on which the sealing resin 35D is formed) of the wafer 40 is ground after the adhesive tape 49 is applied on the wafer 40. FIG. 21D shows a state where the back grinding is provided on the wafer 40. In providing the back grinding on the wafer 40, the backside surface of the wafer 40 is ground in a direction indicated by an arrow Z by means of the grinder 50. The back grinding is provided until the backside surface of the wafer 40 is connected with the deep grooves 46, so that the wafer 40 is cut into the individual semiconductor chips 32B.

However, the individual semiconductor chips 32B are kept attached to the adhesive tape 49 in a state immediately after the back grinding process is over. Therefore, as shown in FIG. 21D, the adhesive tape 49 should be removed from the individual semiconductor chips 32B before the individual semiconductor chips 32B are used. However, the individual semiconductor chips 32B can be shipped with the adhesive tape 49 applied thereto.

As described above, also according to the production method of this embodiment, the contaminant 48 is removed by the laser beam projection in the contaminant removal process so that the individual exposed portions 36 are formed. Therefore, the residual stress generated in the wafer 40 when the individual exposed portions 36 and the deep grooves 46 are formed can be reduced by this method compared with the mechanical method in which the contaminant 48 is removed by machining.

Further, the wafer 40 becomes thinner by being subjected to the back grinding process so as to be prevented from having a warp. Moreover, according to this embodiment, the process of cutting the wafer 40 into the individual semiconductor chips 32B can be performed simultaneously with the back grinding process. Therefore, the production facilities and process can be simplified.

Figure 1:
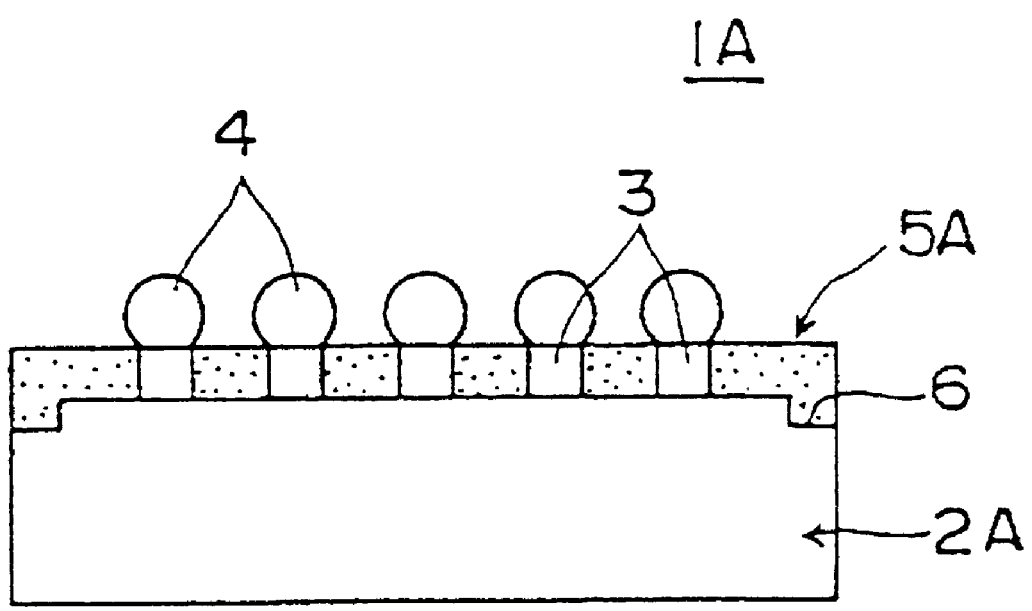
FIG. 1 is a diagram showing a conventional semiconductor vice.
Figures 2A, 2B, 2C:
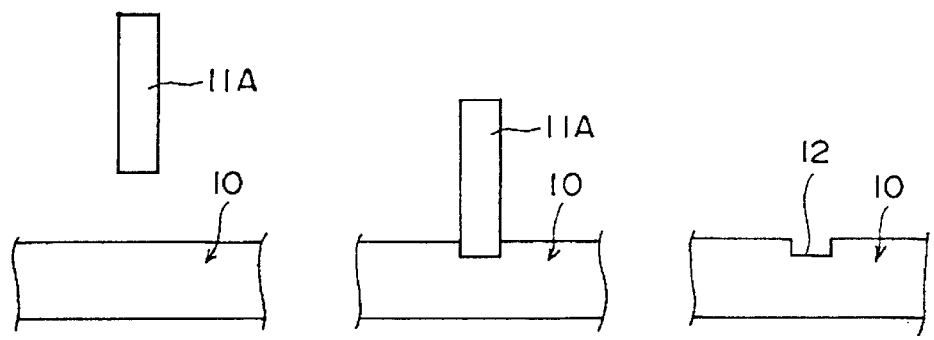
FIGS. 2A through 2G are diagrams for illustrating the outline of a production method of the conventional semiconductor device of FIG. 1.
Figure 2D:
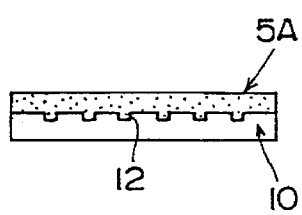
Figure 2E:
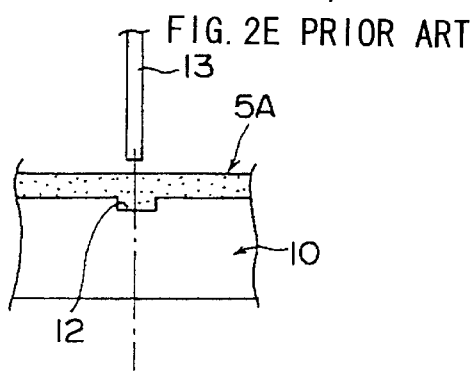
Figure 2F:
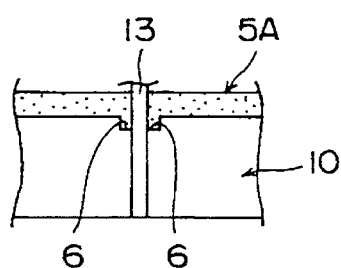
Figure 2G:
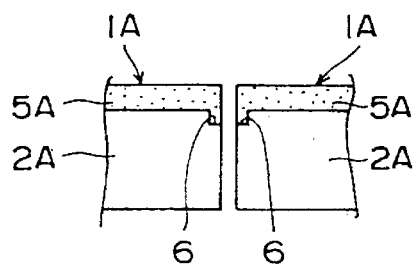
Figure 3:
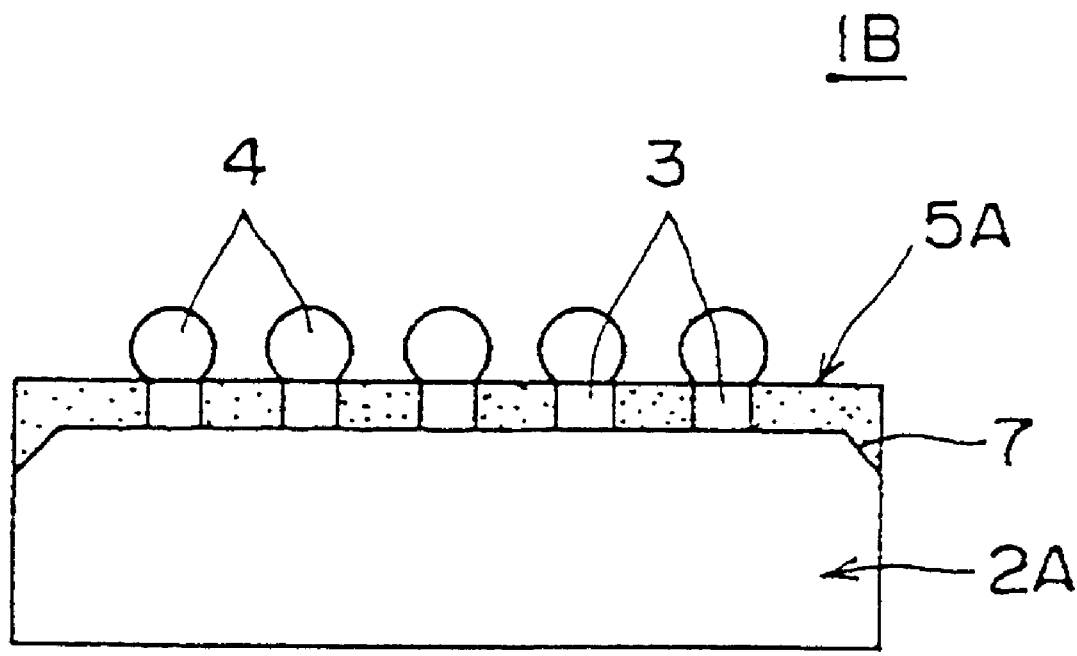
FIG. 3 is a diagram showing another conventional semiconductor device.
Figures 4A, 4B, 4C:
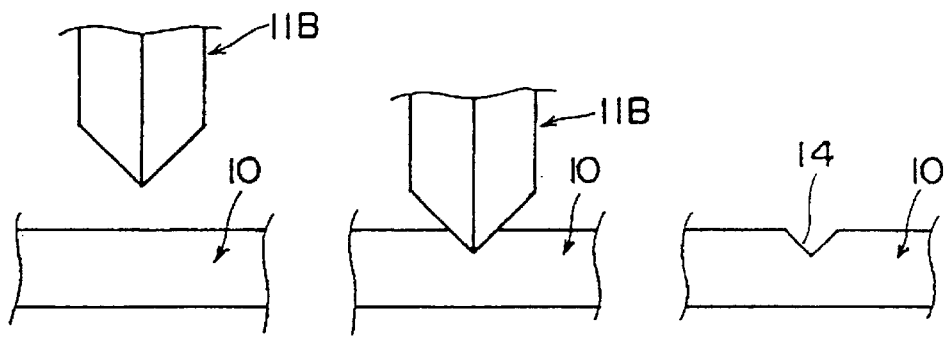
FIGS. 4A through 4G are diagrams for illustrating the outline of a production method of the conventional semiconductor device of FIG. 3.
Figure 4D:
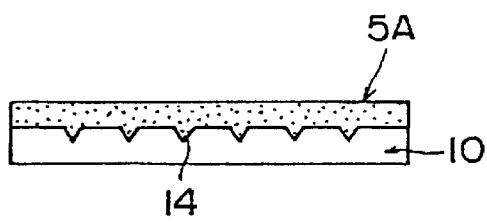
Figure 4E:
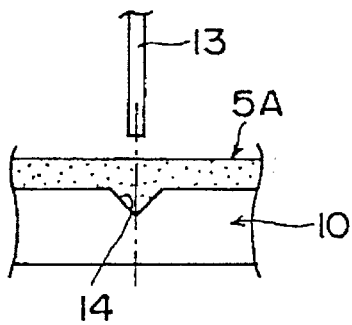
Figure 4F:
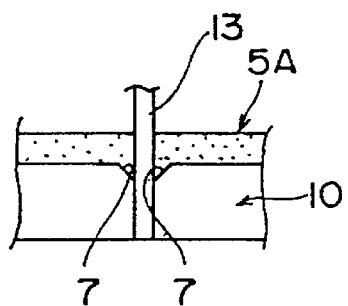
Figure 4G:
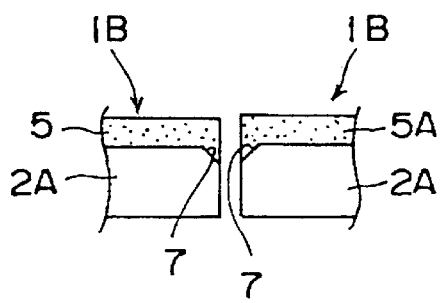
Figure 5A:
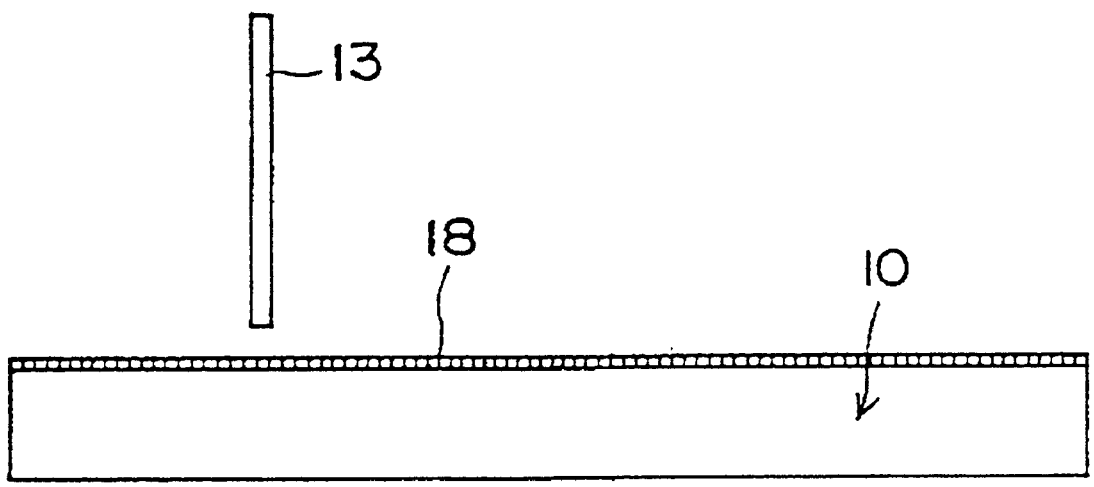
FIGS. 5A and 5B are diagrams for illustrating the outline of a production method of a conventional semiconductor chip.
Figure 5B:
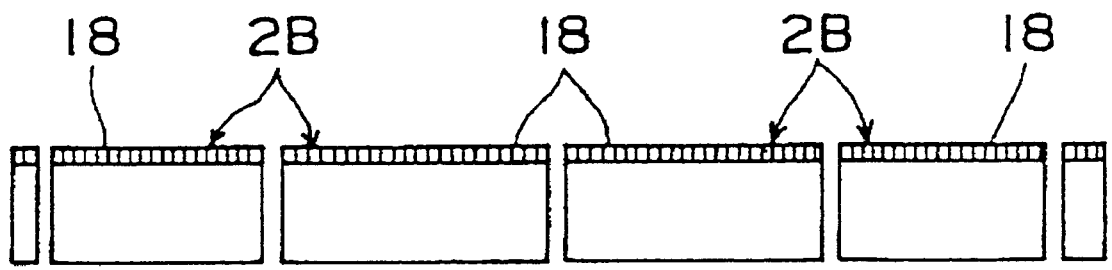
Figure 6:
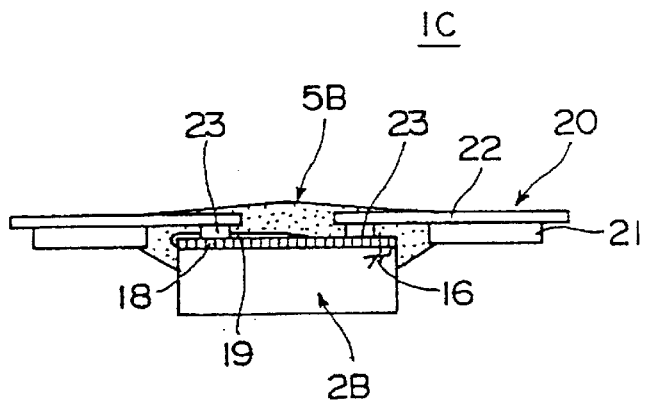
FIG. 6 is a diagram for illustrating a problem arising when the conventional semiconductor chip of FIGS. 5A and 5B is included in a semiconductor device.
Figure 7:
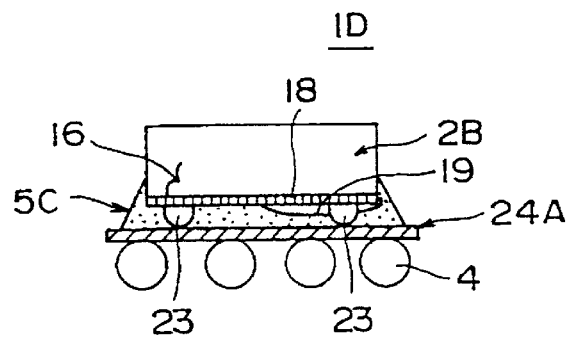
FIG. 7 is a diagram for illustrating another problem arising when the conventional semiconductor chip of FIGS. 5A and 5B is included in a semiconductor device.
Figure 8:
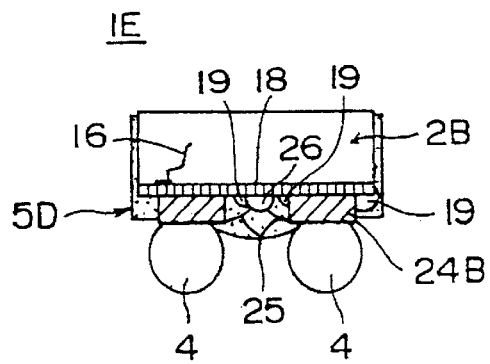
FIG. 8 is a diagram for illustrating another problem arising when the conventional semiconductor chip of FIGS. 5A and 5B is included in a semiconductor device.
Figure 9A:
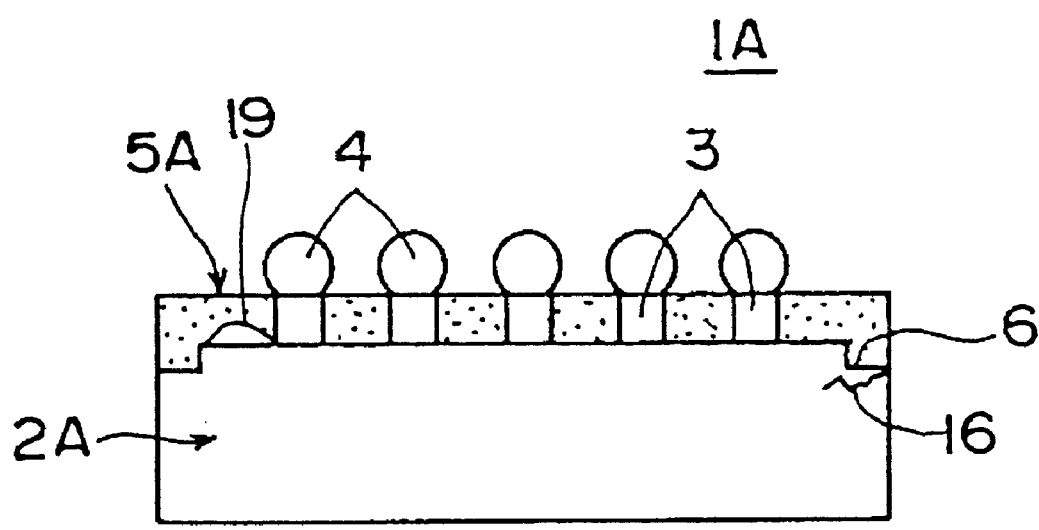
FIGS. 9A and 9B are diagrams for illustrating problems of the conventional semiconductor device of FIG. 1.
Figure 9B:
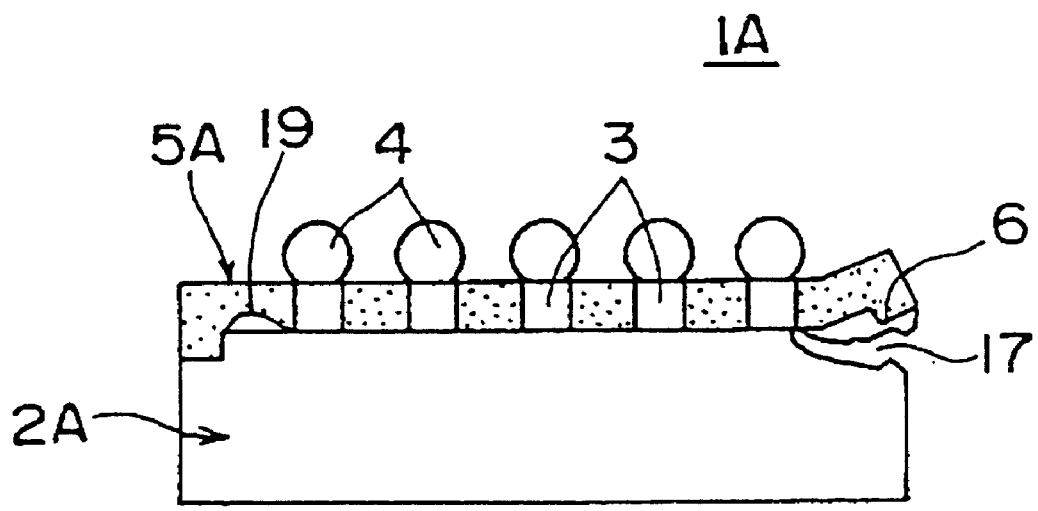
Figure 10A:
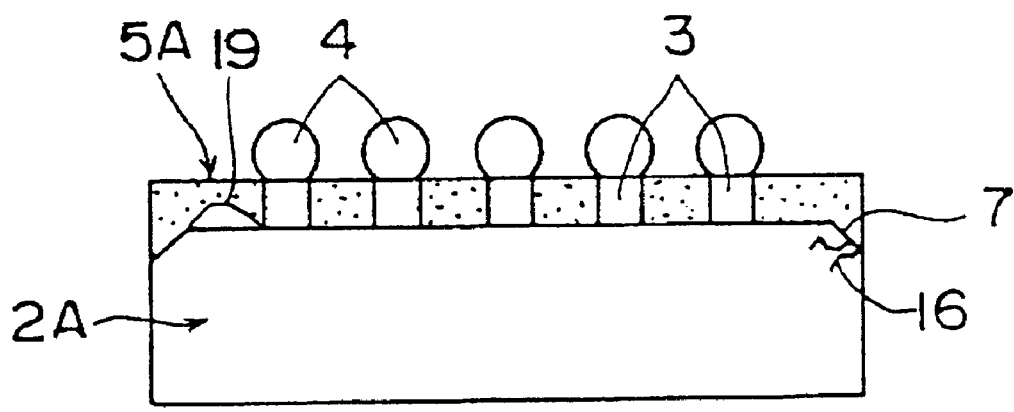
FIGS. 10A and 10B are diagrams for illustrating problems of the conventional semiconductor device of FIG. 2.
Figure 10B:
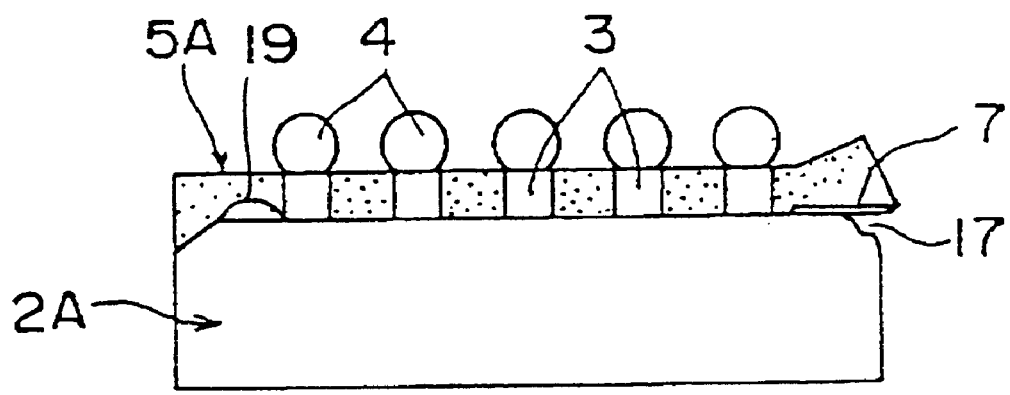
Figure 11A:
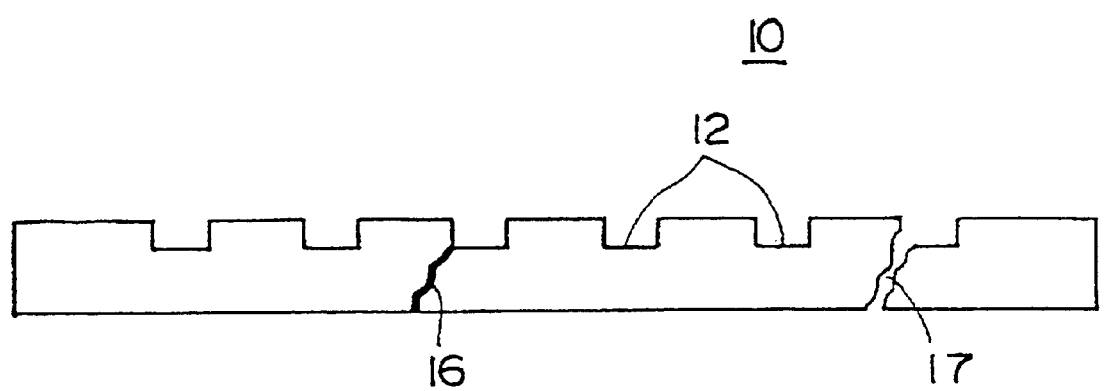
FIGS. 11A and 11B are diagrams for illustrating problems of a conventional production method of a semiconductor device.
Figure 11B:
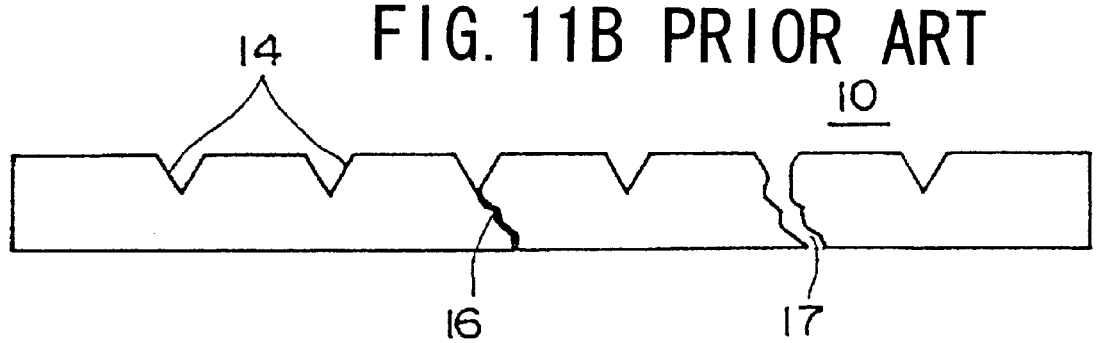

FIGS. 22 through 24 show the semiconductor devices 30B through 30D each including the semiconductor chip 32B produced by the above-described method, respectively. The semiconductor devices 30B through 30D shown in FIGS. 22 through 24 are semiconductor devices of the TCP type, BGA type and FDBGA type, respectively. The semiconductor device 30B has the same structure as the semiconductor device 1C shown in FIG. 6 except for the semiconductor chip 32B. Likewise, the semiconductor devices 30C and 30D respectively have the same structures as the semiconductor devices 1D and 1E shown in FIGS. 7 and 8 except for the respective semiconductor chips 32B. Therefore, a description of the structures of the semiconductor devices 22 through 24 will be omitted.

Sealing resins 35B through 35D are provided to the semiconductor devices 30B through 30D, respectively, for the protection of the circuit-containing surfaces of the respective semiconductor chips 32B. Therefore, the circuit-containing surfaces of the respective semiconductor chips 32B are bonded to the respective sealing resins 35B through 35D.

According to the semiconductor chip 32B of this embodiment, as previously described, the individual exposed portion 36 is formed on the circuit-containing surface thereof. The contaminant 48 is removed by the laser beam projection in the contaminant removal process so that the individual exposed portions 36 are formed. Therefore, the residual stress generated in the wafer 40 when the individual exposed portions 36 are formed can be reduced by this method compared with the mechanical method in which the contaminant 48 is removed by machining. Further, since the deep grooves 46 are formed in the wafer 40 by the laser beam projection in this embodiment, the generation of the residual stress in the wafer 40 can be restrained when the deep grooves 46 are formed.

Therefore, when the semiconductor chips 32B produced by the above-described method are included in the respective semiconductor devices 30B through 30D, the respective semiconductor chips 32B are prevented from having cracks or breakages even if heat is applied to the respective semiconductor devices 30B through 30D after the productions thereof. This increases the respective reliabilities of the semiconductor devices 30B through 30D. Further, the semiconductor chips 32B and the respective semiconductor devices 30B through 30D are bonded firmly in the respective individual exposed portions 36 so that the sealing resins 35B through 35D are prevented from coming off the respective semiconductor chips 32B, thus increasing the respective reliabilities of the semiconductor devices 30B through 30D.

Furthermore, as previously described with reference to FIGS. 20A and 20B, the individual exposed portion 36 includes the bottom portion 43 having the rough surface and the protrusion portion 44 protruding at the edge portion (peripheral portion) of the bottom portion 43. Since the bottom portion 43 of the individual exposed portion 36 includes the rough surface, each of the sealing resins 35B through 35D engages the minute irregularities forming the rough surface. Therefore, the junctions of the sealing resins 35B through 35D and the respective exposed portions 36 are strengthened, thus reliably preventing the sealing resins 35B through 35D from coming off the respective semiconductor chips 32B.

In addition, the protrusion portion 44 sticks into each of the sealing resins 35B through 35D when the sealing resin formation process is over. Therefore, the protrusion portion 44 produces the anchoring effect on each of the sealing resins 35B through 35D, thus reliably preventing the sealing resins 35B through 35D from coming off the respective semiconductor chips 32B.

According to the above-described embodiments, the laser beam is projected on the wafer 40 directly from the laser beam projection apparatus 41. However, although the laser beam projection apparatus 41 is the laser generation apparatus having the short laser pulse width and the high output level, the wafer 40 is inevitably heated by the laser beam projection so that residual stress may be caused in the wafer 40 by the heating. Therefore, a cooling means may be provided to cool the wafer 40 during the laser beam projection.

Figure 25:
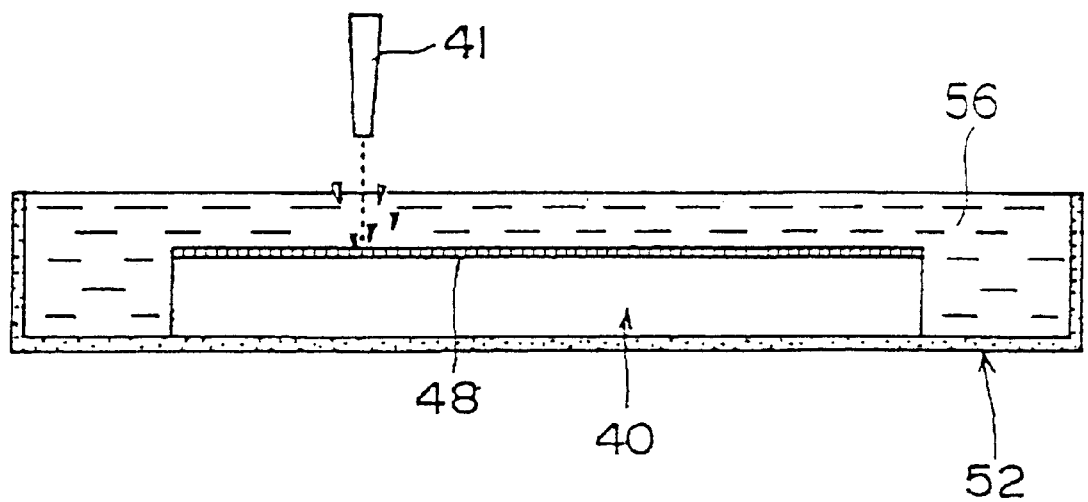
FIG. 25 is a diagram for illustrating a laser beam projection employing a cooling means.

Specifically, as shown in FIG. 25, the laser beam projection can be performed with the wafer 40 being soaked into a cooling medium 56 such as pure water in a cooling medium container 52. This restrains a rise in the temperature of the wafer 40, thus preventing the generation of the residual stress in the wafer 40.

Figure 26:
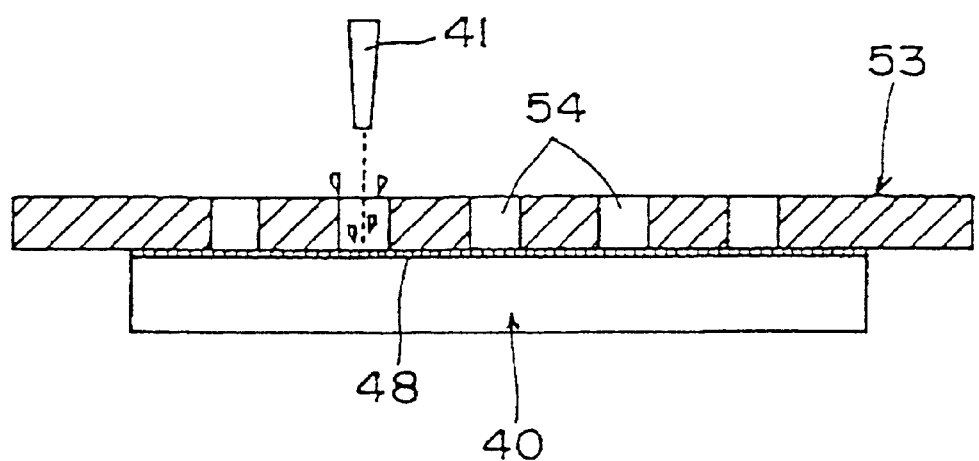
FIG. 26 is a diagram for illustrating a laser beam projection employing a mask.

In order to determine the formation region of the exposed portion 34 of the wafer 40 with high accuracy, the laser beam projection, as shown in FIG. 26, may be performed through a mask 53 including openings 54 formed in advance in positions on which the laser beam is projected.

The present invention is not limited to the specifically disclosed embodiments, and variations and modifications may be made without departing from the scope of the present invention.

The present application is based on Japanese priority application No. 2000-101613 filed on Apr. 3, 2000, the entire contents of which are hereby incorporated by reference.

What is claimed is:

1. A semiconductor device comprising:

a semiconductor chip including external terminals formed on a surface thereof; and a sealing resin formed on the surface of the semiconductor chip, wherein a contaminant film formed on the surface of said semiconductor chip has a laser-processed edge so that a peripheral portion of the surface of said semiconductor chip is bonded to the sealing resin and wherein the bonding strength of the semiconductor chip and the sealing resin is increased in the laser-processed edge so that the sealing resin is prevented from coming off the semiconductor chip.

2. The semiconductor device as claimed in claim 1, wherein a bottom portion of the peripheral portion has a surface rougher than that of the contaminant film.

3. The semiconductor device as claimed in claim 1, wherein a chip material rises at an edge portion of the peripheral portion so as to form a protrusion portion at said edge portion.

4. A semiconductor device comprising:

a semiconductor chip including external terminals formed on a surface thereof; and a sealing resin formed on the surface and sides of said semiconductor chip, wherein a contaminant film formed on the surface of said semiconductor chip has a laser-processed edge so that a peripheral portion of the surface of said semiconductor chip is bonded to the sealing resin and wherein the bonding strength of the semiconductor chip and the sealing resin is increased in the laser-processed edge so that the sealing resin is prevented from coming off the semiconductor chip.

5. The semiconductor device as claimed in claim 4, wherein a bottom portion of the peripheral portion has a surface rougher than that of the contaminant film.

6. The semiconductor device as claimed in claim 4, wherein a chip material rises at an edge portion of the peripheral portion so as to form a protrusion portion at said edge portion.

7. A semiconductor chip included in a semiconductor device including a sealing resin, the semiconductor chip comprising:

electrode portions formed on a surface thereof; and an exposed portion formed in a peripheral portion of the surface, wherein a contaminant film formed on the surface of the semiconductor chip has a laser-processed edge so as to form the exposed portion and wherein the bonding strength of the semiconductor chip and the sealing resin is increased in the laser-processed edge so that the sealing resin is prevented from coming off the semiconductor chip.

8. The semiconductor chip as claimed in claim 7, wherein a surface of a bottom portion of the exposed portion is rougher than that of the contaminant film.

9. The semiconductor chip as claimed in claim 7, wherein a chip material rises at an edge portion of the exposed portion so as to form a protrusion portion at said edge portion.

* * * * *